United States Patent
Fukami et al.

(10) Patent No.: US 9,941,468 B2
(45) Date of Patent: Apr. 10, 2018

(54) MAGNETORESISTANCE EFFECT ELEMENT AND MAGNETIC MEMORY DEVICE

(71) Applicant: TOHOKU UNIVERSITY, Sendai-shi (JP)

(72) Inventors: Shunsuke Fukami, Sendai (JP); Chaoling Zhang, Sendai (JP); Tetsuro Anekawa, Sendai (JP); Hideo Ohno, Sendai (JP); Tetsuo Endoh, Sendai (JP)

(73) Assignee: Tohoku University, Sendai-shi, Miyagi (JP)

( * ) Notice: Subject to any disclaimer, the term of this patent is extended or adjusted under 35 U.S.C. 154(b) by 0 days.

(21) Appl. No.: 15/502,442

(22) PCT Filed: Jul. 29, 2015

(86) PCT No.: PCT/JP2015/071562
§ 371 (c)(1),
(2) Date: Feb. 7, 2017

(87) PCT Pub. No.: WO2016/021468
PCT Pub. Date: Feb. 11, 2016

(65) Prior Publication Data
US 2017/0222135 A1  Aug. 3, 2017

(30) Foreign Application Priority Data
Aug. 8, 2014  (JP) ................................. 2014-163176

(51) Int. Cl.
*G11C 11/00* (2006.01)
*H01L 43/08* (2006.01)
(Continued)

(52) U.S. Cl.
CPC .......... *H01L 43/08* (2013.01); *G11C 11/1673* (2013.01); *G11C 11/1675* (2013.01);
(Continued)

(58) Field of Classification Search
CPC ......... H01L 43/08; H01L 43/02; H01L 43/10; H01L 27/228; H01L 11/1675; H01L 11/1673
(Continued)

(56) References Cited

U.S. PATENT DOCUMENTS 7,696,551 B2 * 4/2010 Xiao ..................... H01L 43/12
257/295
8,722,543 B2 * 5/2014 Belen .................... H01L 43/12
257/295
(Continued)

FOREIGN PATENT DOCUMENTS

JP         2013-541219       11/2013
WO    WO/2012/056348 A1    5/2012
(Continued)

OTHER PUBLICATIONS

Int'l. Search Report issued in Int'l. App. No. PCT/JP2015/071562, dated Sep. 29, 2015.

*Primary Examiner* — Viet Q Nguyen
(74) *Attorney, Agent, or Firm* — Greer Burns & Crain Ltd.

(57) ABSTRACT

A magnetoresistance effect element (100) includes a heavy metal layer (11) that includes a heavy metal and that is formed to extend in a first direction, a recording layer (12) that includes a ferromagnetic material and that is provided adjacent to the heavy metal layer (11), a barrier layer (13) that includes an insulating material and that is provided on the recording layer (12) with being adjacent to a surface of the recording layer (12) opposite to the heavy metal layer (11), and a reference layer (14) that includes a ferromagnetic material and that is provided adjacent to a surface of the barrier layer (13), the surface being opposite to the recording layer (12). The direction of the magnetization of the reference layer (14) has a component substantially fixed in the
(Continued)

first direction, and the direction of the magnetization of the recording layer (12) has a component variable in the first direction. A current having a direction same as the first direction is introduced to the heavy metal layer (11) to thereby enable the magnetization of the recording layer (12) to be inverted.

13 Claims, 21 Drawing Sheets

(51) Int. Cl.
  *H01L 43/02* (2006.01)
  *H01L 43/10* (2006.01)
  *H01L 27/22* (2006.01)
  *G11C 11/16* (2006.01)

(52) U.S. Cl.
  CPC ............ *H01L 27/228* (2013.01); *H01L 43/02* (2013.01); *H01L 43/10* (2013.01)

(58) Field of Classification Search
  USPC .......................................... 365/158, 171, 173
  See application file for complete search history.

(56) References Cited

U.S. PATENT DOCUMENTS

| | | | |
|---|---|---|---|
| 9,218,864 B1* | 12/2015 | Yi | G11C 11/161 |
| 9,230,626 B2* | 1/2016 | Buhrman | G11C 11/18 |
| 9,293,694 B2* | 3/2016 | Yi | G11C 11/16 |
| 9,478,309 B2* | 10/2016 | Nebashi | H01L 43/08 |
| 9,666,256 B1* | 5/2017 | Lai | G11C 11/161 |
| 9,691,458 B2* | 6/2017 | Ralph | G11C 11/18 |
| 2008/0151614 A1* | 6/2008 | Guo | G11C 11/16 365/171 |
| 2010/0244897 A1* | 9/2010 | Saito | G11C 11/16 326/49 |
| 2010/0271870 A1* | 10/2010 | Zheng | B82Y 25/00 365/171 |
| 2011/0044099 A1* | 2/2011 | Dieny | B82Y 25/00 365/171 |
| 2012/0018822 A1 | 1/2012 | Gaudin et al. | |
| 2012/0098077 A1 | 4/2012 | Gaudin et al. | |
| 2012/0267734 A1* | 10/2012 | Sasaki | H01L 29/82 257/421 |
| 2014/0010004 A1 | 1/2014 | Suzuki | |
| 2014/0124882 A1 | 5/2014 | Khalili Amiri et al. | |
| 2014/0169088 A1 | 6/2014 | Buhrman et al. | |
| 2015/0295166 A1 | 10/2015 | Suzuki | |
| 2015/0348606 A1 | 12/2015 | Buhrman et al. | |
| 2016/0247550 A1* | 8/2016 | Fukami | H01L 43/08 |
| 2016/0315249 A1* | 10/2016 | Kardasz | H01L 43/08 |
| 2017/0178705 A1* | 6/2017 | Buhrman | G11C 11/161 |

FOREIGN PATENT DOCUMENTS

| | | |
|---|---|---|
| WO | WO2012/127722 A1 | 9/2012 |
| WO | WO 2013/025994 A2 | 2/2013 |
| WO | WO 2015/068509 A1 | 5/2015 |

* cited by examiner

"0" STORING STATE
LOW RESISTANCE STATE

"1" STORING STATE
HIGH RESISTANCE STATE

"1" STORING STATE
LOW RESISTANCE STATE

"0" STORING STATE
HIGH RESISTANCE STATE

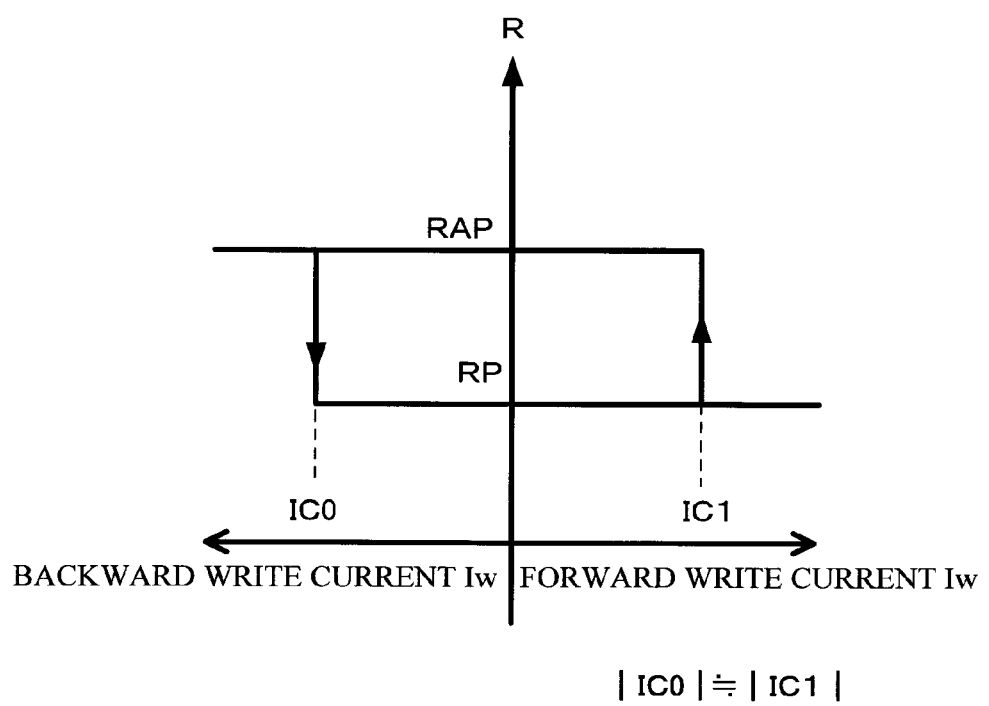

$H_K^{eff}$ (EFFECTIVE MAGNETIC ANISOTROPIC MAGNETIC FIELD DEPENDENCE)

$\alpha$ (DAMPING CONSTANT DEPENDENCE)

$H_{ext}$ (EXTERNAL MAGNETIC FIELD DEPENDENCE)

FIG.15A
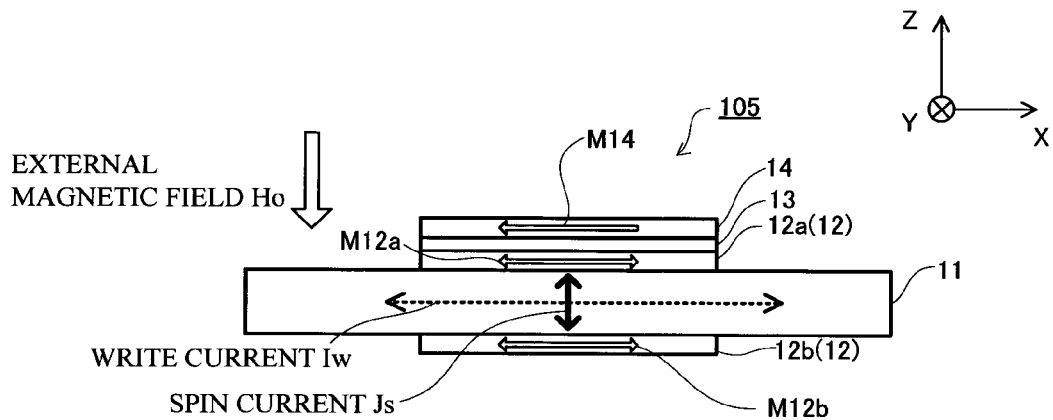
FIG15.B
"0" STORING STATE
LOW RESISTANCE STATE
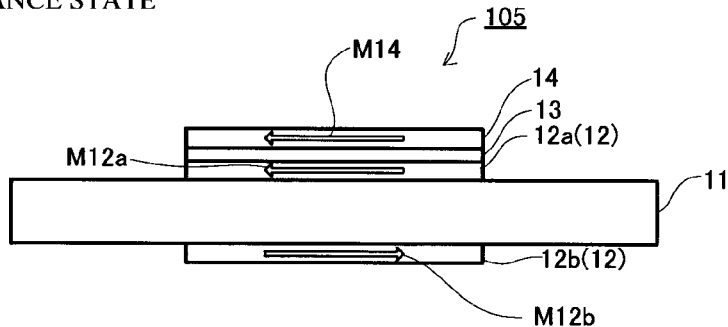
FIG.15C
"1" STORING STATE
HIGH RESISTANCE STATE
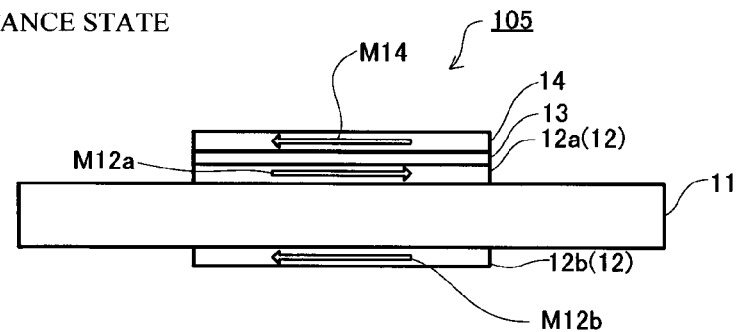

MAGNETORESISTANCE EFFECT ELEMENT AND MAGNETIC MEMORY DEVICE

This is a National Phase Application filed under 35 U.S.C. § 371, of International Application No. PCT/JP2015/071562, filed Jul. 29, 2015.

TECHNICAL FIELD

This disclosure relates to a magnetoresistance effect element and a magnetic memory device.

BACKGROUND ART

A spin-transfer torque magnetic random access memory (STT-MRAM) has attracted attention as a next-generation nonvolatile memory that achieves a high speed and high rewrite endurance. STT-MRAM is a memory where a magnetic tunneling junction element (MTJ element) being a resistance change type storage element is used.

Patent Literature 1 discloses a laminate suitable for a memory cell of a 3-terminal type STT-MRAM. This laminate has a structure where a first outer layer including a non-magnetic material, an intermediate layer (recording layer) including a magnetic material and a second outer layer including a non-magnetic material are laminated. A reference layer including a magnetic material for read is laminated on the first outer layer. In order to write data, a write current in parallel with the intermediate layer is applied to the second outer layer (conductive layer) to invert the magnetization of the intermediate layer by STT. Both the magnetization directions of the intermediate layer and the reference layer are here perpendicular to the in-plane direction of the second outer layer.

Patent Literature 2 also discloses a laminate suitable for a memory cell of a 3-terminal type STT-MRAM. This laminate has, as in Patent Literature 1, a structure where a first outer layer including a non-magnetic material, an intermediate layer (recording layer) including a magnetic material and a second outer layer including a non-magnetic material are laminated. A reference layer for reading data is further laminated on the first outer layer. During write, a write current in parallel with the intermediate layer is applied to the second outer layer (conductive layer) to invert the magnetization of the intermediate layer by STT. Both the magnetization directions of the intermediate layer and the reference layer are here in parallel with the in-plane direction of the second outer layer and perpendicular to the inflow direction of the write current.

CITATION LIST

Patent Literature

Patent Literature 1: U.S. Patent Application Publication No. 2012/0018822
Patent Literature 2: National Patent Publication No. 2013-541219
Patent Literature 3: International Publication No. WO 2013/025994

SUMMARY OF INVENTION

Technical Problem

In the laminate disclosed in Patent Literature 1, the magnetic field leaked from the reference layer may pass through the first outer layer to reach the intermediate layer. In such a case, the magnetization state of the intermediate layer is affected by the magnetic field leaked from the reference layer. Therefore, it is difficult to achieve highly symmetric rewrite property. Furthermore, the data retained may also be rewritten due to the magnetic field leaked from the reference layer. Accordingly, it is difficult to achieve highly symmetric retention property.

In addition, in the laminate disclosed in Patent Literature 2, the intermediate layer has the magnetization direction perpendicular to the inflow direction of the write current (the longitudinal direction of the second outer layer). Therefore, the intermediate layer is required to be formed longwise in the short direction of the second outer layer, resulting in an increase in the size of a memory cell. Furthermore, the laminate in Patent Literature 2, in which the direction of magnetization is inverted by precession, thus has the problems of an increase in threshold current in a nanosecond domain and difficulty in write at a high speed.

Patent Literature 3 also discloses, as in Patent Literature 2, an example where the magnetization directions of a write current and a recording layer are perpendicular to each other, and has the same problems as those of the memory of Patent Literature 2.

The present disclosure has been made in view of the above circumstances, and an objective thereof is to provide a magnetoresistance effect element and a magnetic memory device that are small, that achieve highly symmetric rewrite property and retention property, and that can allow for write at a high speed.

Solution to Problem

In order to achieve the above objective, the magnetoresistance effect element of the present disclosure includes:

a heavy metal layer that includes a heavy metal and that is formed to extend in a first direction;

a recording layer that includes a ferromagnetic material and that is provided adjacent to the heavy metal layer;

a barrier layer that includes an insulating material and that is provided on the recording layer with being adjacent to a surface of the recording layer, the surface being opposite to the heavy metal layer; and a reference layer that includes a ferromagnetic material and that is provided adjacent to a surface of the barrier layer, the surface being opposite to the recording layer;

wherein a direction of magnetization of the reference layer includes a component substantially fixed in the first direction, a direction of magnetization of the recording layer includes a component variable in the first direction, and a current having a direction same as the first direction is introduced to the heavy metal layer to enable the magnetization of the recording layer to be inverted.

The magnetization of the recording layer is desirably inverted by a vertical magnetic field that is applied to the recording layer by introducing a current to the heavy metal layer.

A pulse width of the current introduced to the heavy metal layer is desirably less than 10 nanoseconds.

A magnetization easy axis of the recording layer is desirably directed to a direction within ±25 degrees relative to the first direction.

The recording layer is desirably formed to be substantially two-fold symmetric in a layer surface and a longitudinal direction thereof desirably includes a component in the first direction.

The magnetoresistance effect element may further include an auxiliary magnetic layer having magnetization in a direction perpendicular to a layer surface of the recording layer.

The recording layer may be singly arranged on each of upper and lower surfaces of the heavy metal layer.

The recording layer may have a plurality of regions where a magnetization easy axis is directed to a different direction.

The recording layer may include CoFeB or FeB, and the barrier layer may include MgO.

The recording layer may include, for example, CoFeB, and a thickness of the recording layer may be more than 1.4 nm.

The pulse width of the current introduced to the heavy metal layer may be 0.3 nanoseconds or more and less than 1.2 nanoseconds.

The magnetization easy axis of the recording layer may be directed to a direction at ±3 degrees or more and ±25 degrees or less relative to the first direction.

The magnetic memory device of the present disclosure includes:

the magnetoresistance effect element described above;

write means that writes data in the magnetoresistance effect element by applying a write current to the magnetoresistance effect element to a direction including a component in the first direction; and read means that read the data written in the magnetoresistance effect element by determining a resistance between the heavy metal layer and the reference layer.

Advantageous Effects of Invention

The present disclosure can provide a magnetoresistance effect element and a magnetic memory device that are small, that achieve highly symmetric rewrite property and retention property, and that can allow for write at a high speed.

BRIEF DESCRIPTION OF DRAWINGS

FIG. 5 is a diagram illustrating the changes in write current and resistance R from a heavy metal layer to a reference layer;

FIG. 15A is a view illustrating the structure of a magnetoresistance effect element according to Modified Embodiment 5, where a recording layer is multi-layered;

FIG. 15B is a view illustrating a state where data "0" is recorded on the magnetoresistance effect element according to Modified Embodiment 5;

FIG. 15C is a view illustrating a state where data "1" is recorded on the magnetoresistance effect element according to Modified Embodiment 5;

DESCRIPTION OF EMBODIMENTS

Hereinafter, a magnetoresistance effect element according to each embodiment of the present disclosure, and a magnetic memory device using the magnetoresistance effect element are described with reference to the drawings.

Embodiment 1

Figure 1A:
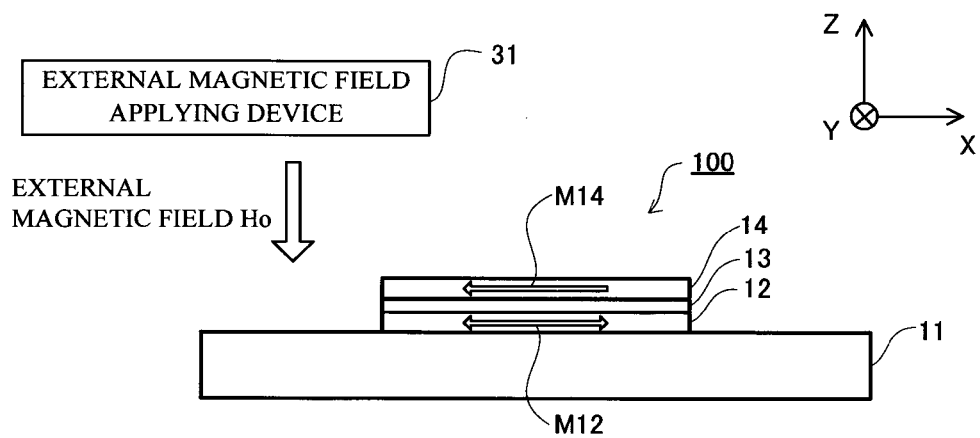
FIG. 1A is a front view of a magnetoresistance effect element according to Embodiment 1 of the present disclosure.
Figure 1B:
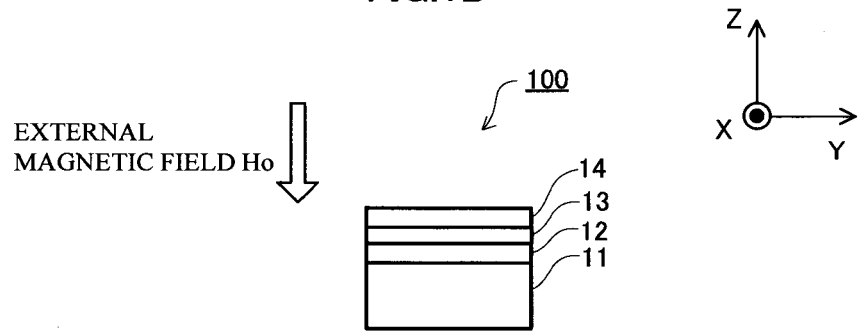
FIG. 1B is a side view of the magnetoresistance effect element according to Embodiment 1.
Figure 1C:
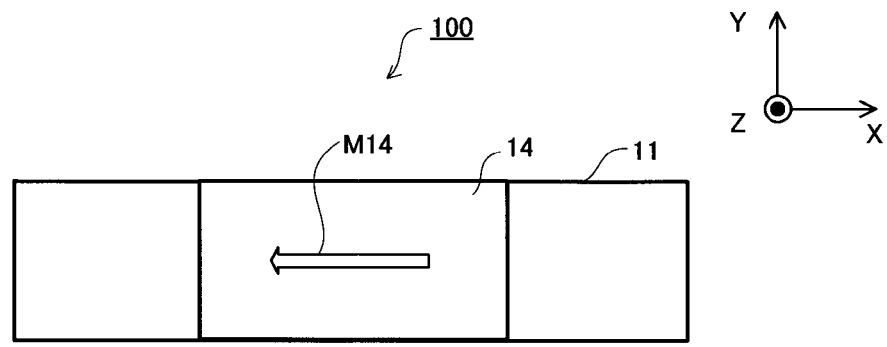
FIG. 1C is a top view of the magnetoresistance effect element according to Embodiment 1.

Hereinafter, a magnetoresistance effect element according to Embodiment 1 is described with reference to FIG. 1 to FIG. 5. FIG. 1A illustrates a front view of a magnetoresistance effect element 100 according to Embodiment 1, FIG. 1B illustrates a side view thereof, and FIG. 1C illustrates a plan view (top view) thereof. The magnetoresistance effect element 100 includes a heavy metal layer 11, a recording layer 12, a barrier layer 13 and a reference layer 14 that are laminated. The longitudinal (elongation) direction (the left/right direction of the page of FIG. 1A) of the heavy metal layer 11 is defined as the X-axis direction. The short direction (the depth of the page of FIG. 1A) of the heavy metal layer 11 is defined as the Y-axis direction. The height direction (the upward/downward direction in the page of FIG. 1A) in which the respective layers of the magnetoresistance effect element 100 are laminated is defined as the Z-axis direction.

The heavy metal layer (conductive layer) 11 includes a heavy metal, and has a (long) planar shape elongated in a first direction (X-axis direction). The heavy metal layer (conductive layer) 11 is a layer formed so that, approximately, the thickness is 0.5 nm to 20 nm, desirably 1 nm to 10 nm, the length in the X-axis direction is 60 nm to 260 nm, desirably 100 nm to 150 nm, and the width in the Y-axis direction is 20 to 150 nm, desirably 60 nm to 120 nm.

As described later, the magnetization direction of the recording layer 12 is rewritten due to a spin generated by application of a write current to the heavy metal layer 11. The write current is applied in the longitudinal direction of the heavy metal layer 11 (X-axis direction). The heavy metal layer 11 includes a heavy metal large in spin-orbit interaction, such as Hf, Ta, W, Re, Os, Ir, Pt or Pb, or an alloy thereof. As the heavy metal layer 11, a conductive material doped with such a heavy metal or an alloy may be used. In order to achieve desired electrical characteristics and structure, a material such as B, C, N, O, Al, Si, P, Ga and/or Ge may be appropriately added to the heavy metal layer 11.

The recording layer 12 is a layer of a ferromagnetic material laminated on the heavy metal layer 11, and is a layer formed so that, approximately, the thickness is 0.5 nm to 5 nm, desirably 1 nm to 2 nm, the length in the X-axis direction is 15 nm to 300 nm, desirably 60 nm to 200 nm, and the width in the Y-axis direction is 20 to 150 nm, desirably about 20 nm to 120 nm. The recording layer 12 has a magnetization easy axis in the X-axis direction. The direction of magnetization indicated by arrow M12 is changed between the +X-axis direction and the −X-axis direction due to spin-orbit torque described later.

A material including Fe, Co and/or Ni is preferably used for the recording layer 12. Specifically, a 3d transition metal such as Fe, Co or Ni, an alloy including 3d transition metals such as Fe—Co, Fe—Ni, Co—Ni, Fe—Co—Ni, Co—Fe—B, Fe—B or Co—B, a film of Fe/Ni, Co/Ni, Co/Pt, Co—Pd or the like alternately laminated or the like can be used for the recording layer 12. In order to achieve desired electrical characteristics and structure, a material such as B, C, N, O, Al, Si, P, Ga and/or Ge may be appropriately added to the recording layer 12.

The barrier layer 13 is laminated on the recording layer 12, and includes an insulating material such as MgO, Al2O3 or AlN. The barrier layer 13 is formed so that the thickness is 0.1 nm to 5 nm, desirably 0.5 nm to 2 nm, for example.

The present disclosure is directed to a case where the recording layer 12 is in in-plane magnetization. The recording layer 12 may be in perpendicular magnetization due to an interface anisotropy effect depending on combinations of the materials and the thicknesses of the recording layer 12 and the barrier layer 13, and it is thus desirable that the recording layer 12 have a thickness so as to be able to avoid from being in perpendicular magnetization due to the interface anisotropy effect, in terms of a relationship with the barrier layer 13. For example, when the barrier layer 13 includes MgO and the recording layer 12 includes CoFeB, the thickness of the recording layer 12 is desirably more than 1.4 nm.

The reference layer 14 includes a ferromagnetic material laminated on the barrier layer 13, and is a layer where a magnetization direction M14 thereof is fixed. When data (information) is read, the data recorded based on the magnetization directions of the reference layer 14 and the recording layer 12 is read. The magnetization direction of the reference layer 14 is fixed in the X-axis direction.

Specific examples of the respective layers of the magnetoresistance effect element 100 are represented as follows: the heavy metal layer 11: Ta, 5 nm in thickness; the recording layer 12: CoFeB, 1.5 nm in thickness; the barrier layer 13: MgO, 1.2 nm in thickness; and the reference layer 14: CoFeB, 1.5 nm in thickness.

Each of the heavy metal layer 11 to the reference layer 14 is obtained by film-formation on a substrate not illustrated, by an ultra-vacuum sputtering method or the like, and thereafter patterning in a proper shape.

It is to be noted that suitable ranges here exemplified with respect to the thickness and dimension are set in view of the state of the art of a current semiconductor integrated circuit. Such thickness and dimension ranges that allow at least one of the effects of the present disclosure to be exerted can be modified along with the progression of a processing technique in future.

A magnetic field (external magnetic field Ho) is applied to the magnetoresistance effect element 100 (more accurately, recording layer 12) by an external magnetic field applying device 31 such as a permanent magnet or an electromagnet. The external magnetic field Ho is applied in the −Z-axis direction or the +Z-axis direction. The external magnetic field Ho is for control of the change in the magnetization direction of the recording layer 12. The external magnetic field Ho is applied to the magnetoresistance effect element 100 at least in a write operation. Alternatively, the external magnetic field Ho may be constantly applied to the magnetoresistance effect element 100. The external magnetic field Ho is described later together with the spin-orbit torque. The external magnetic field Ho has an intensity of about 1 to 500 mT, preferably about 5 to 200 mT, for example.

The write current flowing through the heavy metal layer 11 inverts the direction of the magnetization M12 of the recording layer 12 between the +X-axis direction and the −X-axis direction. Thus, the resistance state of the current pathway from the heavy metal layer 11 to the reference layer 14 is changed between a high resistance state and a low resistance state. One-bit data of "0" and "1" can be allocated in the direction of the magnetization M12 (namely, resistance state) to thereby allow the magnetoresistance effect element 100 to store data. When the data is read from the magnetoresistance effect element 100, a read current Ir is allowed to flow between an electrode (not illustrated) provided on the reference layer 14, and the heavy metal layer 11, to detect the resistance state (identify a high resistance state and a low resistance state) of the magnetoresistance effect element 100. Thus, the direction of the magnetization M12 relative to the direction of the magnetization M14 of the reference layer 14 is determined to read the data recorded.

The read operation and the write operation are described in detail.

First, the read operation is described with reference to FIG. 2A to FIG. 2C.

Figure 2A:
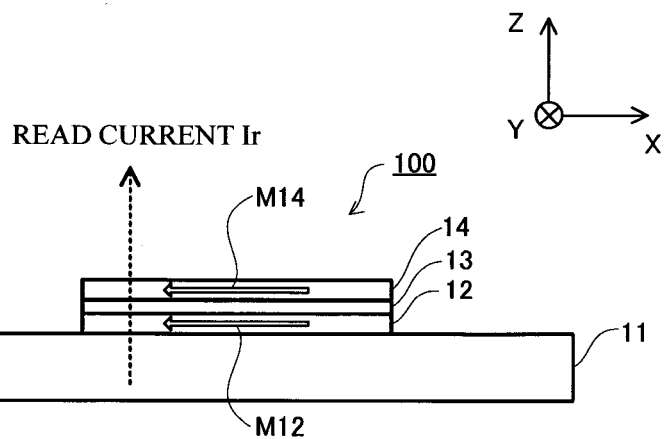
FIG. 2A is a view illustrating a state where a magnetoresistance effect element stores data "0"
Figure 2B:
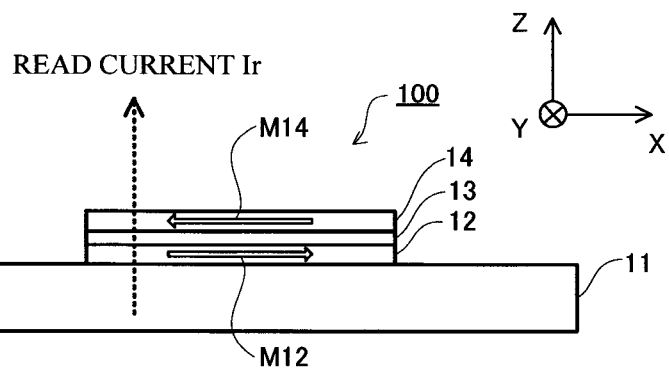
FIG. 2B is a view illustrating a state where a magnetoresistance effect element stores data "1"

In the state of FIG. 2A, the direction of the magnetization M12 of the recording layer 12 is the −X-axis direction, and aligns in the direction of the magnetization M14 of the reference layer 14 (parallel state). The magnetoresistance effect element 100 is here in a low resistance state where the resistance of the current pathway from the heavy metal layer 11 to the reference layer 14 is relatively low. On the other hand, in the state of FIG. 2B, the direction of the magnetization M12 of the recording layer 12 is the +X-axis direction, and is opposite to the direction of the magnetization M14 of the reference layer 14 (antiparallel state). The magnetoresistance effect element 100 is here in a high resistance state where the resistance of the current pathway from the heavy metal layer 11 to the reference layer 14 is relatively high. The two states, such a low resistance state and a high resistance state, can correspond to "0" and "1", respectively, and the direction of the magnetization M12 of the recording layer 12 can be switched to thereby allow the magnetoresistance effect element 100 to be operated as a memory. In the present embodiment, the low resistance state illustrated in FIG. 2A is defined as "0", and the high resistance state illustrated in FIG. 2B is defined as "1". The data stored may be allocated conversely. While an example is here illustrated where the read current Ir flows in the +Z-axis direction, the direction of the read current Ir may be reverse.

Next, the write operation is described with reference to FIG. 3A to FIG. 3C and FIG. 4A to FIG. 4C.

Figure 3A:
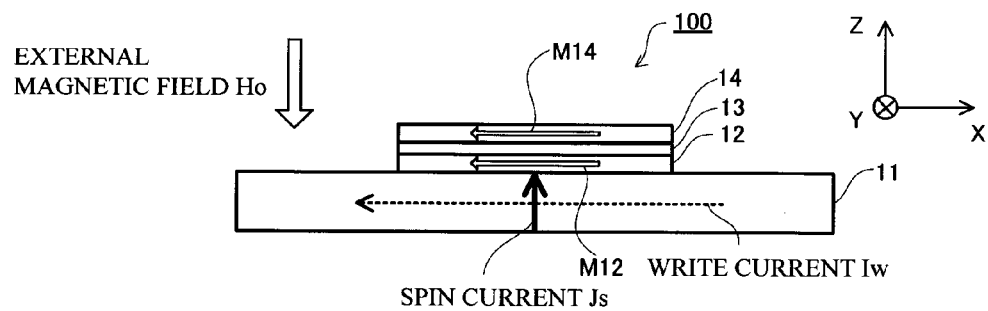
FIG. 3A is a view for describing an operation for writing data in a magnetoresistance effect element, and is a view illustrating a magnetoresistance effect element to which data "1" is not written yet.
Figure 3B:
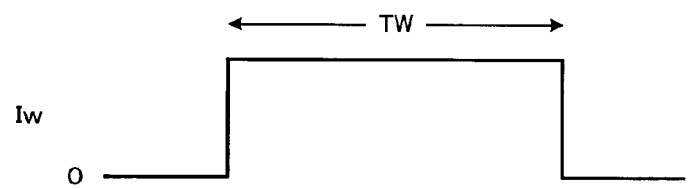
FIG. 3B is a waveform diagram of a write current for writing data "1"
Figure 3C:
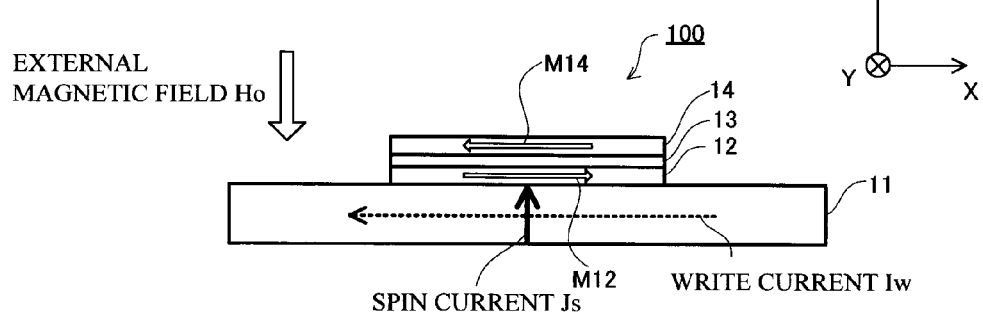
FIG. 3C is a view illustrating a magnetoresistance effect element to which data "1" has been written.

An example is described where data "1" is written in a magnetoresistance effect element 10 that stores data "0". As illustrated in FIG. 3A, a write current Iw is allowed to flow in the longitudinal direction of the heavy metal layer 11 and in the same direction as that of the magnetization M12 of the recording layer 12, with the external magnetic field Ho being kept. The write current Iw is a pulse-shaped current as illustrated in FIG. 3B. A spin current (spin angular momentum flow) Js generated by the spin Hall effect and/or the like is then in the +Z-axis direction. Therefore, a spin is eccentrically located, and spin-orbit torque acts on the recording layer 12. Thus, as illustrated in FIG. 3C, the direction of the magnetization M12 of the recording layer 12 is inverted, and the magnetoresistance effect element 100 is then in an antiparallel state. The magnetoresistance effect element 100 is here in a high resistance state. That is, the data "0" stored in the magnetoresistance effect element 100 is rewritten into "1". The direction of the magnetization M12 of the recording layer 12 is kept even when the write current Iw is 0 and the external magnetic field H0 is 0. The height of the pulse of the write current Iw is equal to or more than a forward threshold IC1 described later. The pulse width Tw of the write current Iw corresponds to a time equal to or more than a time required for rewrite, and in the present embodiment, is less than 30 nanoseconds, for example, 0.1 nanoseconds or more and less than 10 nanoseconds.

Figure 4A:
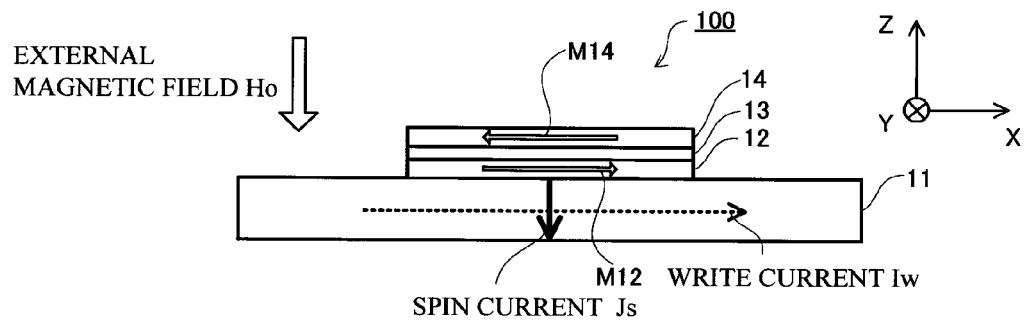
FIG. 4A is a view illustrating a magnetoresistance effect element to which data "0" is not written yet.
Figure 4B:
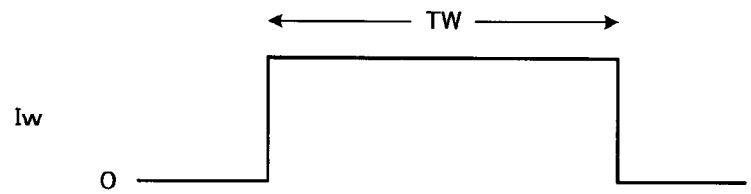
FIG. 4B is a waveform diagram of a write current for writing data "0"
Figure 4C:
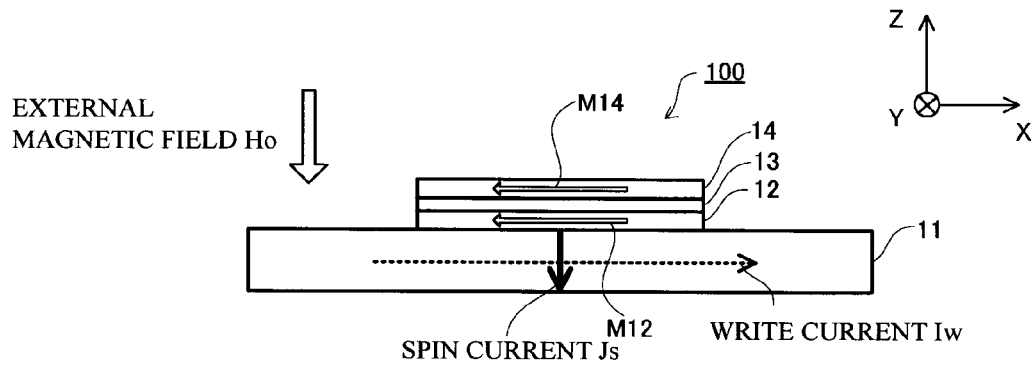
FIG. 4C is a view illustrating a magnetoresistance effect element to which data "0" has been written.

On the other hand, when data "0" is written in a magnetoresistance effect element 100 that stores data "1", a write current Iw is allowed to flow in the longitudinal direction of the heavy metal layer 11 and in the same direction as that of the magnetization M12 of the recording layer 12 in a pulse-shaped manner, with the external magnetic field Ho being kept, as illustrated in FIG. 4A. The write current Iw is a pulse-shaped current as illustrated in FIG. 4B. In the case, a spin current Js in the −Z-axis direction is generated by the spin Hall effect and/or the like. Therefore, a spin is eccentrically located, and spin-orbit torque acts on the recording layer 12. Thus, as illustrated in FIG. 4C, the direction of the magnetization M12 of the recording layer 12 is inverted, and the magnetoresistance effect element 100 is then in a parallel state. The magnetoresistance effect element 100 is here in a low resistance state. That is, the data "1" stored in the magnetoresistance effect element 100 is rewritten into "0". The direction of the magnetization M12 of the recording layer 12 is kept even when the write current Iw is 0 and the external magnetic field H0 is 0. The height of the pulse of the write current Iw is equal to or more than a backward threshold IC0 described later. The pulse width Tw of the write current Iw corresponds to a time equal to or more than a time required for rewrite of the data, and in the present embodiment, is less than 30 nanoseconds, for example, 0.1 nanoseconds or more and less than 10 nanoseconds.

Thus, the data retained in the magnetoresistance effect element 100 can be rewritten.

Herein, when the write current Iw for writing data "0" is allowed to flow through the heavy metal layer 11 of a magnetoresistance effect element 100 that stores data "0", the spin-orbit torque and the external magnetic field Ho are canceled each other out, and therefore the data is not rewritten. Much the same is true on the case where the write current Iw for writing data "1" is allowed to flow through the heavy metal layer 11 of a magnetoresistance effect element 100 that stores data "1".

A relationship between the write current Iw and the resistance value R between the heavy metal layer 11 and the reference layer 14 is illustrated in FIG. 5. As illustrated therein, a forward (−X-axis direction) write current Iw equal to or more than the threshold Ic1 allows the direction of the magnetization M12 of the recording layer 12 to be opposite to the direction of the magnetization M14 of the reference layer 14 (antiparallel). The magnetic resistance R here is a relatively high value RAP. On the other hand, a backward (+X-axis direction) write current Iw equal to or more than the threshold Ic0 allows the direction of the magnetization M12 of the recording layer 12 to be the same as the direction of the magnetization M14 of the reference layer 14 (parallel). The magnetic resistance R here is a relatively low value RP. The absolute values of the thresholds Ic1 and Ic0 of the write current Iw where the data stored is rewritten are almost the same.

A relationship between the direction of the write current Iw and the direction of the spin current is changed depending on the materials for use in the heavy metal layer 11, the recording layer 12 and the barrier layer 13, and combinations thereof.

During such write, an external magnetic field Ho is required to be constantly applied. While the external magnetic field Ho directed to the −Z-axis direction is illustrated in FIG. 3A, FIG. 3C, FIG. 4A and FIG. 4C, the external magnetic field Ho may be directed to the +Z-axis direction.

Next, a mechanism where the direction of the magnetization M12 of the recording layer 12 is inverted by the spin-orbit torque as described above is described in detail with reference to FIG. 6A and FIG. 6B. A mechanism is here described where the magnetization M12 is inverted when the spin-orbit torque works by the spin Hall effect.

Figure 6A:
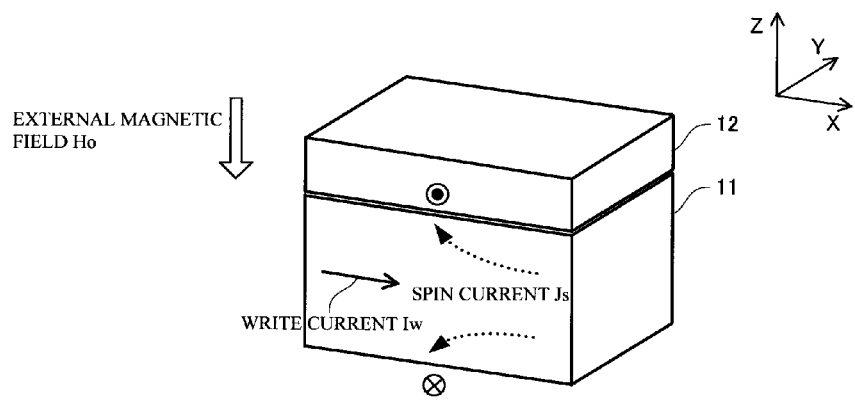
FIG. 6A is a view for describing a spin current.

FIG. 6A schematically illustrates the behavior of the spin current Js in flowing of the write current Iw in the +X-axis direction to the heavy metal layer 11. When the write current Iw is allowed to flow in the +X-axis direction, spin-polarized electrons in the +Y-axis direction are scattered in the −Z-axis direction, and spin-polarized electrons in the −Y-axis direction are scattered in the +Z-axis direction. The spin-polarized electrons in the −Y-axis direction are thus accumulated in the recording layer 12. Herein, the sign of the current, and the scattering direction and the magnitude of the spin polarized are determined by the sign of a spin Hall angle, and can also be reversed from the above.

The spin-polarized electrons in the −Y-axis direction exert a torque on the magnetization M12 of the recording layer 12. Such a torque corresponds to the spin-orbit torque. The spin-orbit torque is classified to two types in terms of the action thereof, and such respective types can be represented by a vertical magnetic field and a lateral magnetic field. The type of the torque represented by the vertical magnetic field corresponds to antidamping-like torque or Slonczewski torque. The type of the torque represented by the lateral magnetic field corresponds to field-like torque.

Figure 6B:
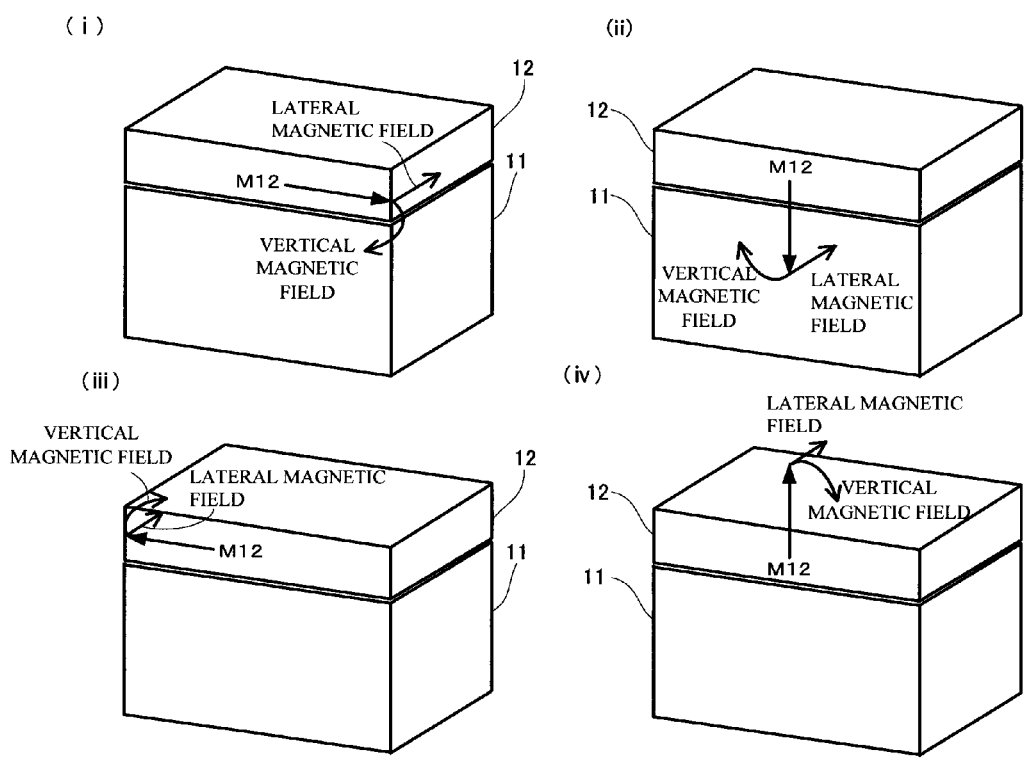
FIG. 6B including portions (i) to (iv) is a view for describing magnetization rotation by spin-orbit torque.

FIG. 6B including portions (i) to (iv) schematically illustrates the directions of the vertical magnetic field and the lateral magnetic field with the magnetization M12 of the recording layer 12 being directed to four directions.

The lateral magnetic field is always directed to the +Y-axis direction. On the other hand, the vertical magnetic field is directed to a direction where the magnetization M12 is rotated in the X-Z plane. The directions of the vertical magnetic field and the lateral magnetic field are changed by a combination of materials to be used.

It is here assumed as illustrated in FIG. 6A that the external magnetic field Ho is applied in the −Z-axis direction. The magnetization M12 is here rotated in the −Z-axis direction by the vertical magnetic field in the state in portion (i) of FIG. 6B, namely, a state where the magnetic field M12 is directed to the +X-axis direction, and undergoes the state in portion (ii) of FIG. 6B, and reaches the state in portion (iii) of FIG. 6B where the magnetic field M12 is directed to the −X-axis direction. While the vertical magnetic field works in the +Z-axis direction in the state in portion (iii) of FIG. 6B, no additional rotation of the direction of the magnetization M12 occurs because there is the external magnetic field Ho in the −Z-axis direction. Accordingly, the state illustrated in portion (iii) of FIG. 6B is the final state.

On the other hand, when the direction of the write current Iw allowed to flow in the heavy metal layer 11 is changed in the state in portion (iii) of FIG. 6B, the direction of the vertical magnetic field is changed by 180°. Thus, the magnetization M12 is changed from the state in portion (iii) of FIG. 6B through the state in portion (ii) of FIG. 6B to the final state in portion (i) of FIG. 6B, and settled in this state.

On the other hand, when the direction of the external magnetic field Ho is the +Z-axis direction and the write current Iw and the effective magnetic field illustrated are adopted, the state illustrated in portion (ii) of FIG. 6B corresponds to an inhibited state. The state in portion (iii) of FIG. 6B is changed through the state in portion (iv) of FIG. 6B to the state in portion (i) of FIG. 6B, and the state in portion (i) of FIG. 6B is changed through the state in portion (iv) of FIG. 6B to the state in portion (iii) of FIG. 6B again, depending on the direction of the write current Iw. Thus, the state can be made to be back and forth between the state in portion (i) of FIG. 6B and the state in portion (iii) of FIG. 6B.

While the above description is based on the spin Hall effect, both the vertical magnetic field and the lateral magnetic field act on the magnetization M12 also by the Rashba effect. Accordingly, the same inversion process of magnetization is observed. In addition, if the vertical magnetic field can be generated by a current, the magnetization direction can be controlled by the aforementioned system even by any effect other than the spin Hall effect and the Rashba effect.

The present disclosure is common with Patent Literature 1 in that a main driving force of magnetization inversion is the vertical magnetic field (antidamping-like torque or Slonczewski torque) and spin-polarized electrons in a direction perpendicular to magnetization act on magnetization. On the other hand, the present disclosure is different from Patent Literature 2 that discloses the following: polarized electrons act on magnetization in parallel or antiparallel with magnetization. When a polarized electron spin acts in antiparallel with magnetization, magnetization is inverted by precession and therefore a large current is required in order to allow magnetization inversion to occur in a nanosecond domain. On the other hand, when a polarized electron spin acts in a direction perpendicular to magnetization, almost no threshold current is increased even if the pulse width is decreased. Accordingly, the present disclosure is suitable in terms of realizing of a high-speed operation (see Applied Physics Letters, Vol. 104, 072413 (2014).). In general, when data is rewritten by an antiparallel electron spin, the write current Iw is required to have a pulse width of 10 nanoseconds or more. On the contrary, according to the aforementioned embodiment, rewrite can be made by a write current Iw having a pulse width of from 0.1 nanoseconds to less than 10 nanoseconds because data is rewritten by a perpendicular electron spin. It is shown from the experiment of the inventors that a high-speed rewrite performance is achieved (the detail is described later). It is noted that, even when the pulse width of the write current Iw is in the range from 10 nanoseconds to 30 nanoseconds, a rewrite speed comparable with the rewrite speed through precession by a conventional antiparallel electron spin can be ensured. In addition, the magnetization direction in a steady state is an in-plane direction in the present disclosure, and is different from Patent Literature 1 and is the same as Patent Literature 2 in this point.

Figure 7:
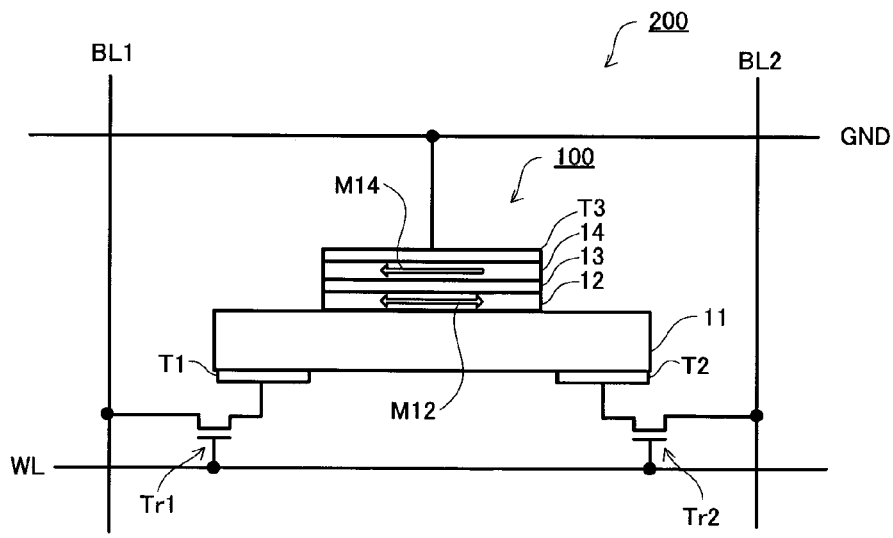
FIG. 7 illustrates an example of the configuration of a memory cell circuit of one bit, where the magnetoresistance effect element according to Embodiment 1 is used.

Next, an example of a memory cell circuit where the above magnetoresistance effect element 100 is used as a storage element is described with reference to FIG. 7. FIG. 7 illustrates a magnetic memory cell circuit 200 of one bit. The magnetic memory cell circuit 200 includes a magnetoresistance effect element 100 forming a memory cell of one bit, a pair of bit lines BL1 and BL2, a word line WL, a ground line GND, a first transistor Tr1, and a second transistor Tr2.

The magnetoresistance effect element 100 has a 3-terminal type structure where a first terminal T1 is connected to one end of the heavy metal layer 11, a second terminal T2 is connected to the other end thereof, and a third terminal T3 is arranged on the reference layer 14.

The third terminal T3 is connected to the ground line GND. The first terminal T1 is connected to the drain of the first transistor Tr1. The second terminal T2 is connected to the drain of the second transistor Tr2. Gate electrodes of the first transistor Tr1 and the second transistor Tr2 are connected to the word line WL. The source of the first transistor Tr1 is connected to a first bit line BL1. The source of the second transistor Tr2 is connected to a second bit line BL2.

The method for writing data in the magnetoresistance effect element 100 is as follows. First, a signal at an active level, for switching on the transistors Tr1 and Tr2, is applied to the word line WL in order to select the magnetoresistance effect element 100. The transistors Tr1 and Tr2 are here assumed to include an N-channel MOS transistor. The word line WL is here set to a High level. The first transistor Tr1 and the second transistor Tr2 are thus on-state. On the other hand, one of the first bit line BL1 and the second bit line BL2 is set to a High level and the other thereof is set to a ground level depending on data to be written.

Specifically, when data "1" is written, the first bit line BL1 is set to a Low level and the second bit line BL2 is set to a High level. Thus, the write current Iw flows forward as illustrated in FIG. 3A, and data "1" is written as illustrated in FIG. 3C. On the other hand, when data "0" is written, the first bit line BL1 is set to a High level, and the second bit line BL2 is set to a Low level. Thus, as illustrated in FIG. 4A, the write current Iw flows backward, and data "0" is written as illustrated in FIG. 4C.

Bit data is thus written in the magnetoresistance effect element 100.

The method for reading the data stored in the magnetoresistance effect element 100 is as follows. First, the word line WL is set to an active level, and the first transistor Tr1 and the second transistor Tr2 are switched on. Both the first bit line BL1 and the second bit line BL2 are each set to a High level, or one of the bit lines BL1 and BL2 is set to a High level and the other thereof is set to an open state. A current is allowed to flow through the bit line being at a High level, in the following order: the heavy metal layer 11, the recording layer 12, the barrier layer 13, the reference layer 14, the third terminal T3, and the ground line GND. The magnitude of the current can be measured to thereby determine the magnitude of the resistance of the pathway from the heavy metal layer 11 to the reference layer 14, namely, the stored data.

The structure and circuit operations of the magnetic memory cell circuit 200 are examples, and can be appropriately modified. For example, the ground may be set to a reference voltage other than the ground voltage. The third terminal T3 may also be connected not to the ground line GND, but to the third bit line (not illustrated). In the case, in order to read data, not only the word line WL is set to a High level, but also the third bit line is set to a High level, and one or both of the first bit line and the second bit line is set to a ground level. A current may also be thus allowed to flow from the third bit line to the first bit line BL1 and the second bit line BL2.

Next, the structure of a magnetic memory device 300 including a plurality of the magnetic memory cell circuits 200 exemplified in FIG. 7 is described with reference to FIG. 8.

Figure 8:
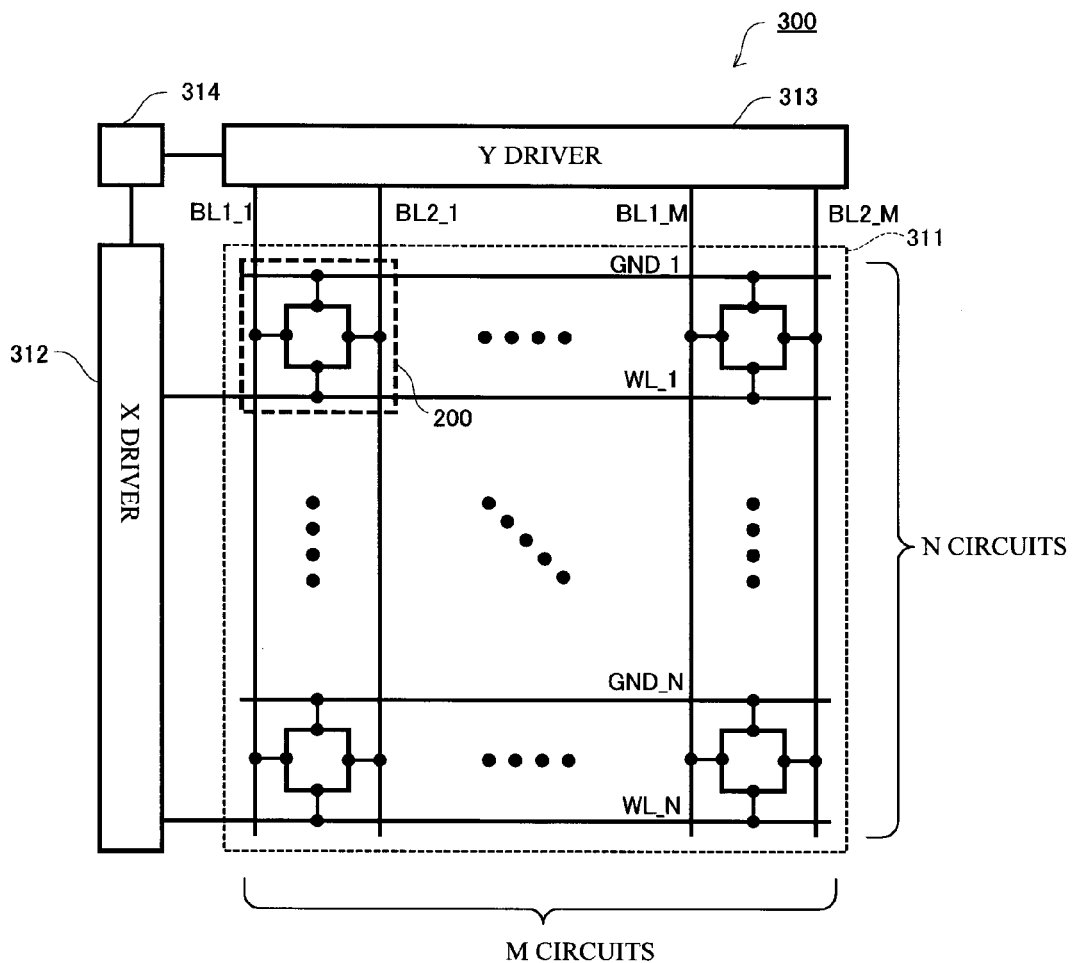
FIG. 8 is a block diagram of a magnetic memory device where a plurality of the memory cell circuits illustrated in FIG. 7 are arranged.

The magnetic memory device 300 includes a memory cell array 311, an X driver 312, a Y driver 313 and a controller 314, as illustrated in FIG. 8. The memory cell array 311 has magnetic memory cell circuits 200 arranged in an array of N rows and M columns. Each magnetic memory cell circuit 200 in each column is connected to a pair of a first bit line BL1 and a second bit line BL2 of the corresponding column. In addition, each magnetic memory cell circuit 200 in each row is connected to a word line WL and a ground line GND of the corresponding row.

The X driver 312 is connected to a plurality of word lines WL, decodes a low address received, and drives a word line WL of a row to be accessed, to an active level. For example, when the first and second transistors T11 and Tr2 are each an N-channel MOS transistor, the X driver 312 drives the word line WL to a High level.

The Y driver 313 serves as write means for writing data in the magnetoresistance effect element 100 and read means for reading data from the magnetoresistance effect element 100. The Y driver 313 is connected to a plurality of first bit lines BL1 and a plurality of second bit lines BL2. The Y driver 313 decodes a column address received, and sets a first bit line BL1 and a second bit line BL2 connected to a magnetic memory cell circuit 200 to be accessed, to a data write state or a data read state. In write of data "1", the Y driver 313 sets a first bit line BL1 and a second bit line BL2 connected to a magnetic memory cell circuit 200 for write, to a Low level and a High level, respectively. In addition, in write of data "0", the Y driver 313 sets a first bit line BL1 and a second bit line BL2 connected to a magnetic memory cell circuit 200 for write, to a High level and a Low level, respectively. Furthermore, in read of the data stored in the magnetic memory cell circuit 200, the Y driver 313 first sets both a first bit line BL1 and a second bit line BL2 connected to a magnetic memory cell circuit 200 for read, to a High level, or one of the bit lines BL1 and BL2 to a High level and the other thereof to an open state. The Y driver 313 then compares the current flowing through the bit lines BL1 and BL2 with a reference value to determine the resistance state of each magnetic memory cell circuit 200 in each column, thereby reading the stored data.

The controller 314 controls each of the X driver 312 and the Y driver 313 depending on data write or data read.

While the ground line GND connected to the reference layer 14 of the magnetoresistance effect element 100 is connected to the X driver 312, it can also be replaced with a read bit line connected to the Y driver 313, as described above.

Embodiment 2

It is necessary to stably fix the direction of the magnetization M14 of the reference layer 14 in order to stably write and read the stored data in the magnetoresistance effect element 100 according to Embodiment 1. It is effective that the reference layer 14 includes a laminated ferri-coupled layer in order to stabilize the magnetization M14 of the reference layer 14.

Hereinafter, an embodiment of a magnetoresistance effect element 101 including a laminated ferri-coupled layer as a reference layer 14 is described with reference to FIG. 9A to FIG. 9C.

In the present embodiment, the reference layer 14 has a laminated structure where a ferromagnetic layer 14a, a coupling layer 14b and a ferromagnetic layer 14c are laminated and laminated ferri-coupled. The ferromagnetic layer 14a and the ferromagnetic layer 14c are antiferromagnetically coupled by the coupling layer 14b. Other elements are essentially the same as in Embodiment 1.

It is desirable to use a ferromagnetic material including Fe, Co and/or Ni for the ferromagnetic layer 14a and the ferromagnetic layer 14c. In addition, it is desirable to use Ru, Ir and/or the like for the coupling layer 14b.

In such a configuration, when the direction of the magnetization M12 of the recording layer 12 is matched with the direction of the magnetization M14a of the ferromagnetic layer 14a in the reference layer 14, the layer 14a being close to the recording layer 12, the magnetoresistance effect element 101 is in a parallel state, and is in a low resistance state. On the other hand, when the direction of the magnetization M12 of the recording layer 12 is opposite to the direction of the magnetization M14a of the ferromagnetic layer 14a, the magnetoresistance effect element 101 is in an antiparallel state, and is in a high resistance state.

Figure 9A:
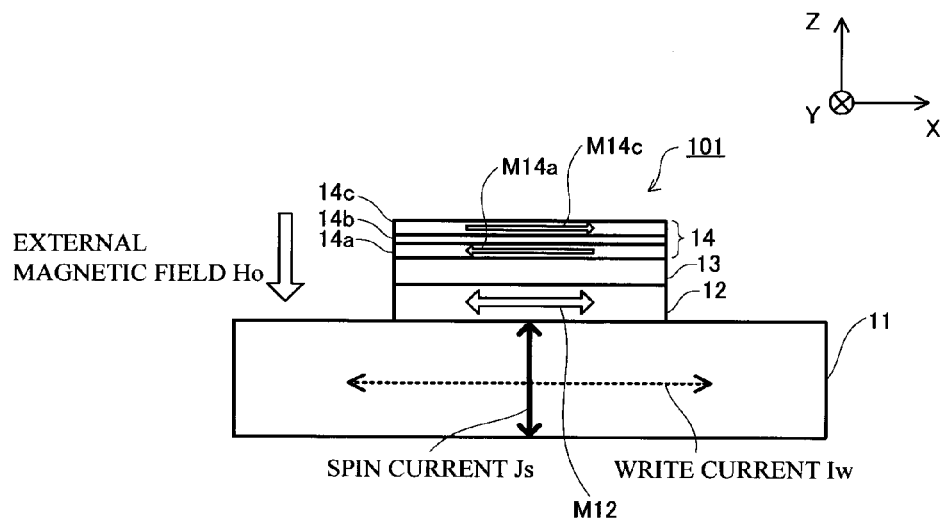
FIG. 9A is a front view of a magnetoresistance effect element including a multi-layered reference layer, according to Embodiment 2.
Figure 9B:
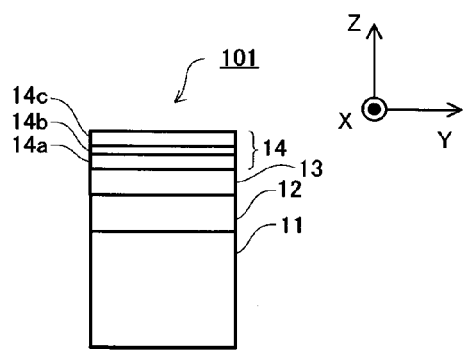
FIG. 9B is a side view of the magnetoresistance effect element according to Embodiment 2.
Figure 9C:
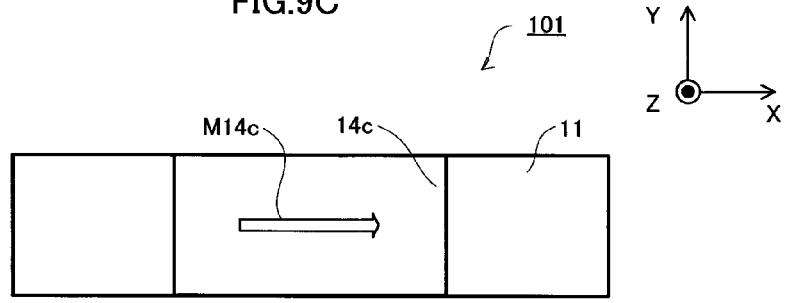
FIG. 9C is a top view of the magnetoresistance effect element according to Embodiment 2.

In order to determine characteristics of the magnetoresistance effect element 101 illustrated in FIG. 9A to FIG. 9C, various numerical values were calculated based on the Landau-Lifshitz-Gilbert equation (LLG equation).

Figure 10A:
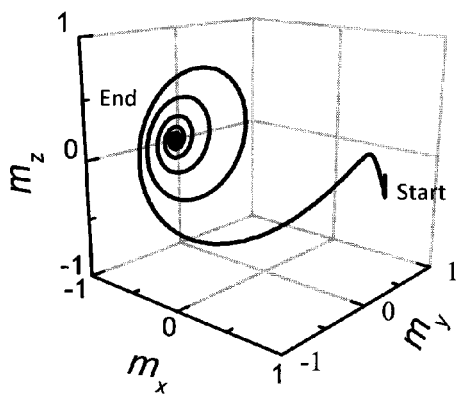
FIG. 10A is a graph representing a history where the magnetization direction of the magnetoresistance effect element according to Embodiment 2 is inverted.

FIG. 10A illustrates the calculation results of the time evolution of the locus of the magnetization of the magnetoresistance effect element 101. Such calculation was made from 0 seconds to 5 nanoseconds. In FIG. 10A, axes mx, my and mz represent the magnetization intensities in the +X-axis direction, +Y-axis direction and +Z-axis direction, respectively. A negative value indicates the negative direction of each axis. In the example, it can be seen that the magnetization of the recording layer, directed to the +X-axis direction in the start state (Start) at (mx, my, mz)=(1,0,0), is inverted to be directed to the −X-axis direction in the end state (End) at (mx, my, mz)=(−1,0,0). Calculation was made with the parameters being changed, and the magnetization was thus found to be inverted in the order of about 100 picoseconds. Accordingly, it has been found that data can be written and rewritten at a very high speed.

Figure 10B:
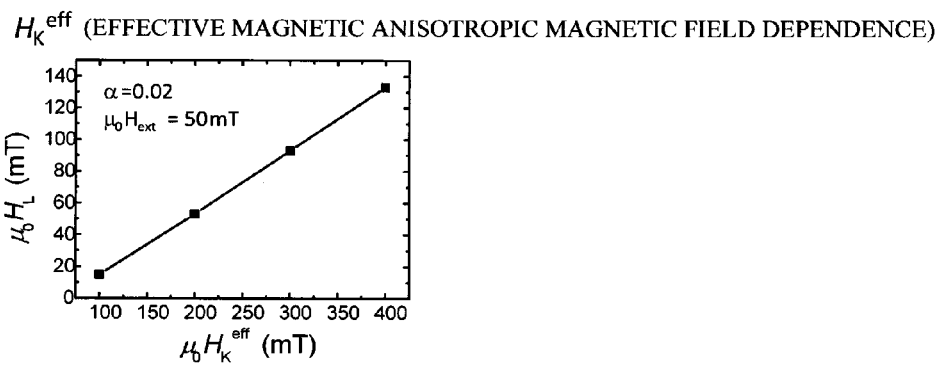
FIG. 10B is a graph representing the effective magnetic anisotropic magnetic field dependence of the magnetoresistance effect element according to Embodiment 2.
Figure 10C:
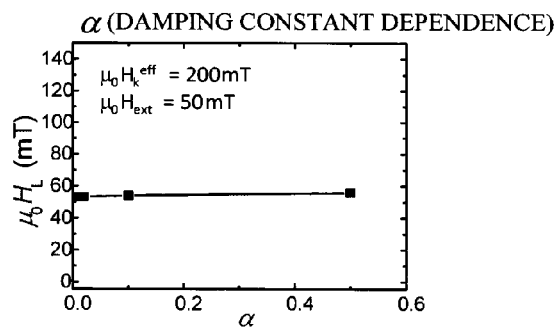
FIG. 10C is a graph representing the damping constant dependence of the magnetoresistance effect element according to Embodiment 2.
Figure 10D:
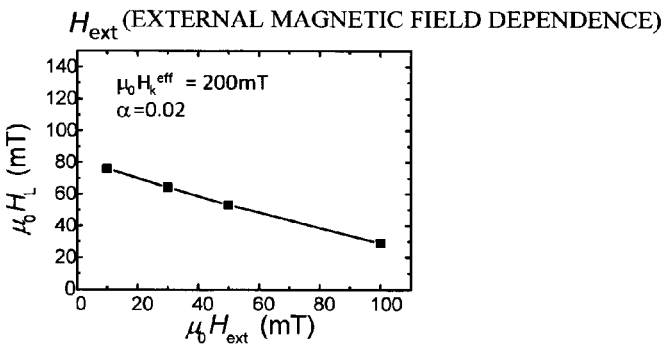
FIG. 10D is a graph representing the calculation results of the threshold current required for magnetization inversion at the change in the external magnetic field of the magnetoresistance effect element according to Embodiment 2.

FIG. 10B to FIG. 10D illustrate the calculation results of a threshold current required for magnetization inversion at the changes in the effective magnetic anisotropic magnetic field, the damping constant and the external magnetic field in the X-axis direction of the recording layer. Since a relationship between a current and a vertical magnetic field is linear, the vertical axis represents the vertical magnetic field HL in FIG. 10B to FIG. 10D. The conversion efficiency between the vertical magnetic field HL and the write current Iw varies depending on a combination of materials to be used.

As illustrated in FIG. 10B, when the effective magnetic anisotropic magnetic field is increased, the threshold current is linearly increased. Indeed, heat stability serving as an index of retention property of the recording information of an element is in a linear relationship with an effective magnetic anisotropic magnetic field, and therefore the effective magnetic anisotropic magnetic field is properly adjusted to a required value.

As illustrated in FIG. 10C, the threshold current has almost no damping constant dependence. In addition, according to dynamics calculation, it has been found that, as the damping constant is higher, the convergence of the magnetization direction to the end state is faster. Accordingly, the damping constant is desirably higher. For example, when the damping constant is 0.05 or more, a magnetization operation at about 100 picoseconds can be made.

As illustrated in FIG. 10D, as the external magnetic field is larger, the threshold current is decreased. Therefore, it is desirable that the external magnetic field applied be large as much as possible.

Such calculation results mean that the magnetoresistance effect element 101 according to Embodiment 2 can be operated at a speed of nanoseconds. The magnetoresistance effect element 100 according to Embodiment 1 also achieves the same characteristic, and therefore can be operated at a high-speed operation.

In addition, the magnetoresistance effect elements 100 and 101 according to the above embodiments can achieve highly symmetric write property and information retention property. Such achievement is described below.

Figure 11A:
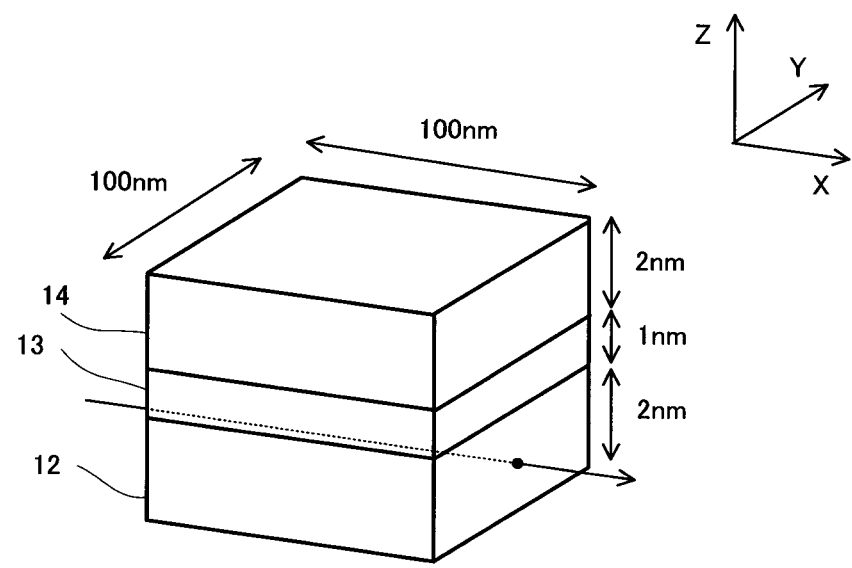
FIG. 11A is a view for comparison in leakage magnetic field between the magnetoresistance effect element according to Embodiment 1 and a vertical magnetoresistance effect element, and is a view illustrating the element structure.

A case where the reference layer 14 includes a single magnetic layer as illustrated in FIG. 11A is here discussed. The thicknesses of the reference layer 14, the barrier layer 13 and the recording layer 12 are assumed to be 2 nm, 1 nm and 2 nm, respectively, and the lengths of the X-axis direction and the Y-axis direction are assumed to be each 100 nm. The saturation magnetization of the reference layer 14 is assumed to be 1 T. The leakage magnetic fields formed on the recording layer 12 in respective cases where the magnetization direction of the reference layer 14 is the +Z-axis direction (perpendicular magnetization) and the −X-axis direction (in-plane magnetization) are compared.

Each of the leakage magnetic fields is calculated along the +X-axis direction, and the origin thereof is defined as the center of the recording layer 12.

Figure 11B:
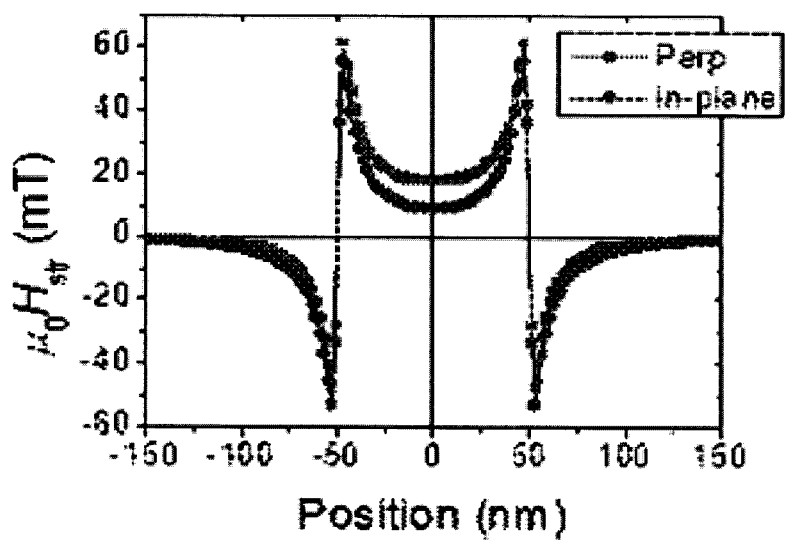
FIG. 11B is a graph for comparison in leakage magnetic field between the magnetoresistance effect element according to Embodiment 1 and the vertical type magnetoresistance effect element, and is a graph representing the intensity distribution of the leakage magnetic field.

As illustrated in FIG. 11B, a strong leakage magnetic field (Hstr) is generated in an adjacent area over ±50 nm (the periphery of the magnetoresistance effect element) even in both cases where the saturation magnetization direction of the reference layer 14 is the +Z-axis direction (Perp) and the −X-axis direction (In-plane). The magnitude of the leakage magnetic field, however, is smaller in In-plane than Perp on the recording layer 12. The magnitude of the leakage magnetic field in Perp is about twice the magnitude of the leakage magnetic field in In-plane around the origin (pattern center portion).

It is meant that the structure in Embodiment 1 including an in-plane magnetization easy MTJ can allow the leakage magnetic field applied to the recording layer 12 from the reference layer 14 to be smaller than the structure of a magnetoresistance effect element including a perpendicular magnetization easy MTJ. While the leakage magnetic field from the reference layer 14 stabilizes one state (for example, a state where "0" is recorded) in the recording layer 12, the leakage magnetic field from the reference layer 14 unstabilizes the other state (for example, a state where "1" is recorded) in the recording layer 12. Accordingly, write property and retention property are caused to be asymmetric, which is not preferable. It can be said based on the foregoing that the in-plane magnetization easy MTJ according to Embodiments 1 and 2 is used to thereby easily impart highly symmetric write property and retention property. Even when the reference layer 14 illustrated in FIG. 9A to FIG. 9C has a laminated structure with laminated ferri-coupling, the above magnitude relationship with respect to the leakage magnetic field from the reference layer 14 is not changed.

It can be seen from the foregoing that the magnetoresistance effect elements 100 and 101 according to Embodiment 1 and Embodiment 2 achieve a high TMR ratio and are excellent in read property. It can also be seen that highly symmetric rewrite property and retention property are achieved. Furthermore, magnetization inversion of the recording layer 12 is not magnetization inversion via precession, thereby enabling write at a high speed.

In addition, the Y-axis direction as the short direction of the heavy metal layer 11 is not defined as the longitudinal direction of the recording layer 12, and therefore a decrease in cell area can be achieved as compared with a case where the longitudinal direction of the heavy metal layer is substantially perpendicular to the longitudinal direction of the recording layer (a case where the direction of the write current is perpendicular to the magnetization direction of the recording layer).

The present disclosure is not limited to the above embodiments, and can be variously modified. Hereinafter, modified embodiments and application examples are described.

Modified Embodiment 1

Allocation of the resistance and the data of the magnetoresistance effect element is arbitrarily determined, and data "1" and data "0" may also be allocated to a low resistance state and a high resistance state, respectively.

Modified Embodiment 2

Figure 12A:
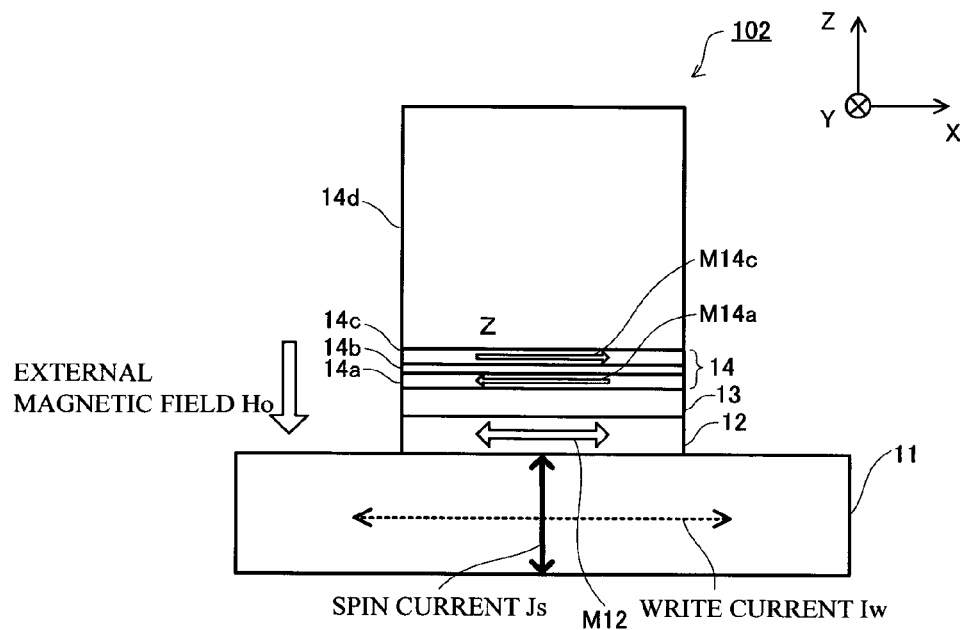
FIG. 12A is a front view of a magnetoresistance effect element according to Modified Embodiment 2, where an antiferromagnetic layer is arranged on a reference layer.
Figure 12B:
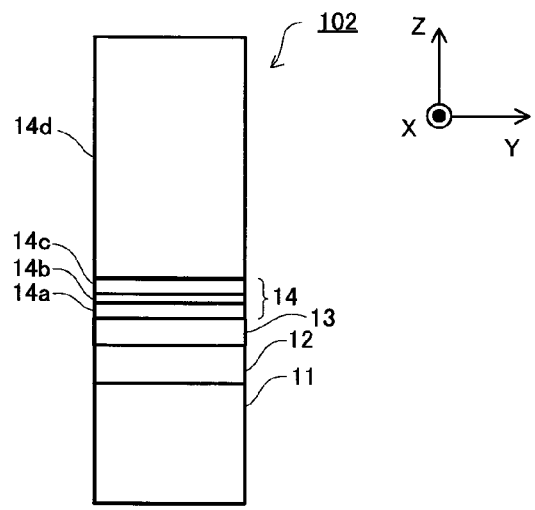
FIG. 12B is a side view of the magnetoresistance effect element according to Modified Embodiment 2.
Figure 12C:
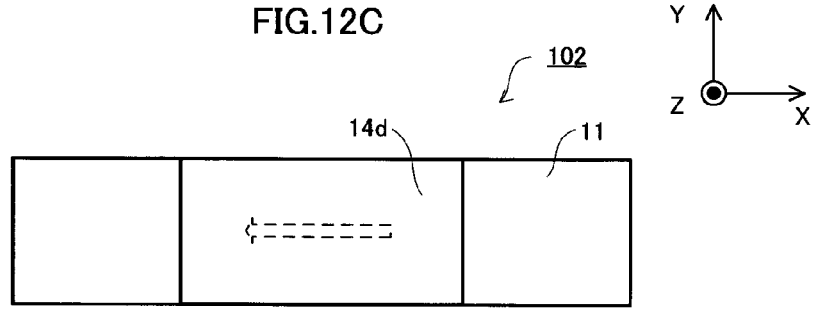
FIG. 12C is a plan view of the magnetoresistance effect element according to Modified Embodiment 2.

In order to stabilize the magnetization of the reference layer 14, an antiferromagnetic layer 14d may be arranged on the reference layer 14 as illustrated in FIG. 12A to FIG. 12C. Ir—Mn, a Pt—Mn alloy or the like can be used as the material of the antiferromagnetic layer 14d. The antiferromagnetic layer 14d can be arranged to thereby more firmly fix the magnetization of the reference layer 14. When the reference layer 14 has a ferri-coupling structure, the number of ferromagnetic layers is arbitrarily selected and may be, for example, 3 or more.

Modified Embodiment 3

While the external magnetic field Ho is applied by the external magnetic field applying device 31 in the above embodiments, the magnetoresistance effect elements 100 and 101 by themselves may apply a perpendicular magnetic field.

Figure 13A:
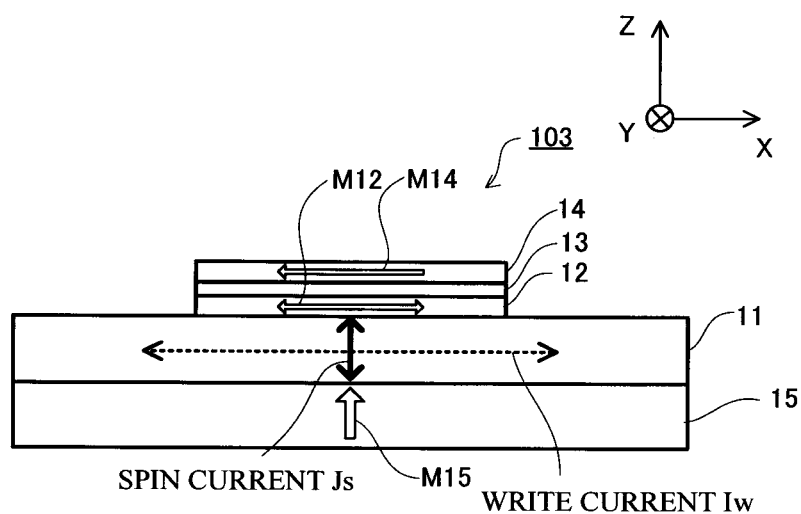
FIG. 13A is a front view of a structure where an auxiliary magnetic layer is arranged on a heavy metal layer, according to Modified Embodiment 3.
Figure 13B:
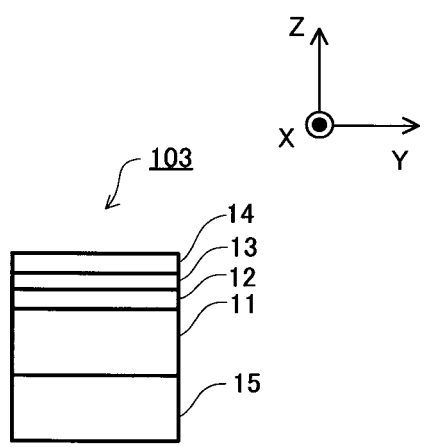
FIG. 13B is a side view of the structure where an auxiliary magnetic layer is arranged on a heavy metal layer, according to Modified Embodiment 3.

For example, a magnetoresistance effect element 103 illustrated in FIG. 13A and FIG. 13B includes an auxiliary magnetic layer 15, in addition to the basic structure indicated in Embodiments 1 and 2. A magnetoresistance effect element 104 illustrated in FIG. 13C and FIG. 13D includes an auxiliary magnetic layer 17, in addition to the basic structure indicated in Embodiments 1 and 2. The auxiliary magnetic layers 15 and 17 have magnetizations M15 and M17 fixed in the Z-axis direction, respectively. The magnetization direction may be the +Z-axis direction or −Z-axis direction.

Figure 13C:
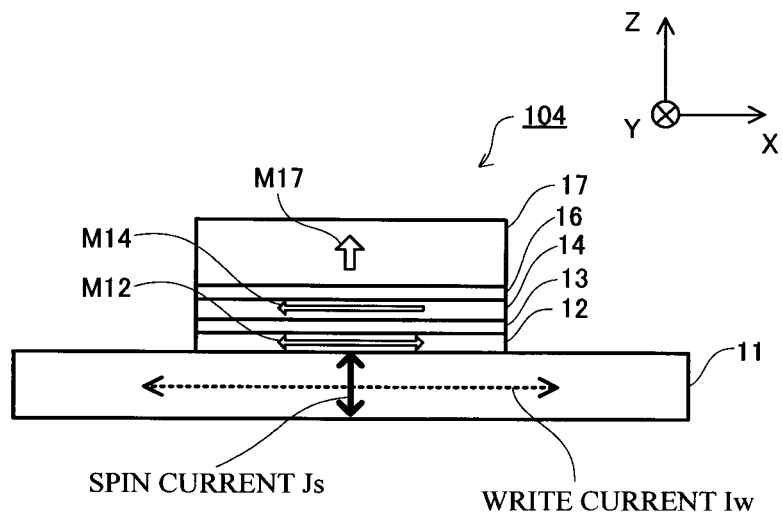
FIG. 13C is a front view of a structure where an auxiliary magnetic layer is arranged on a reference layer, according to Modified Embodiment 3.
Figure 13D:
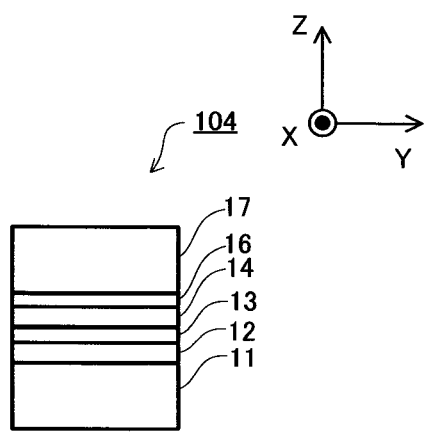
FIG. 13D is a side view of the structure where an auxiliary magnetic layer is arranged on a reference layer, according to Modified Embodiment 3.

The auxiliary magnetic layer 15 of the magnetoresistance effect element 103 illustrated in FIG. 13A and FIG. 13B is arranged on a surface of the heavy metal layer 11, the surface being opposite to the surface on which the recording layer 12 is provided. The auxiliary magnetic layer 17 of the magnetoresistance effect element 104 illustrated in FIG. 13C and FIG. 13D is arranged on the reference layer 14. In order to prevent exchange coupling with the reference layer 14 in such a case, a conductive layer 16 including a conductive non-magnetic material is arranged between the auxiliary magnetic layer 17 and the reference layer 14. The auxiliary magnetic layer 15 or the auxiliary magnetic layer 17 stably applies a stationary magnetic field Ho to a direction perpendicular to the recording layer 12. Accordingly, any mechanism that applies the external magnetic field Ho is unnecessary in such a case.

As illustrated in FIG. 11B, a relatively large leakage magnetic field can occur in a perpendicular magnetization easy axis. In an example of FIG. 11B, about 20 mT of a leakage magnetic field occurs even in the pattern center portion. The magnitude of the magnetic field is of the same order as that of the magnitude of a magnetic field where the reduction effect of the threshold current illustrated in FIG. 10D is exerted. It can also be thus understood that any mechanism that applies the external magnetic field is unnecessary.

In Embodiments 1 and 2, the recording layer 12 has the same width as that of the heavy metal layer 11 and has a short rectangular shape. If the magnetization easy axis direction of the recording layer 12 includes an X-axis component, however, the shape of the recording layer 12 is arbitrarily determined, provided that the recording layer 12 preferably has substantially two-fold symmetry within the ununiformity range occurring in the process in the X-Y plane.

Figure 14:
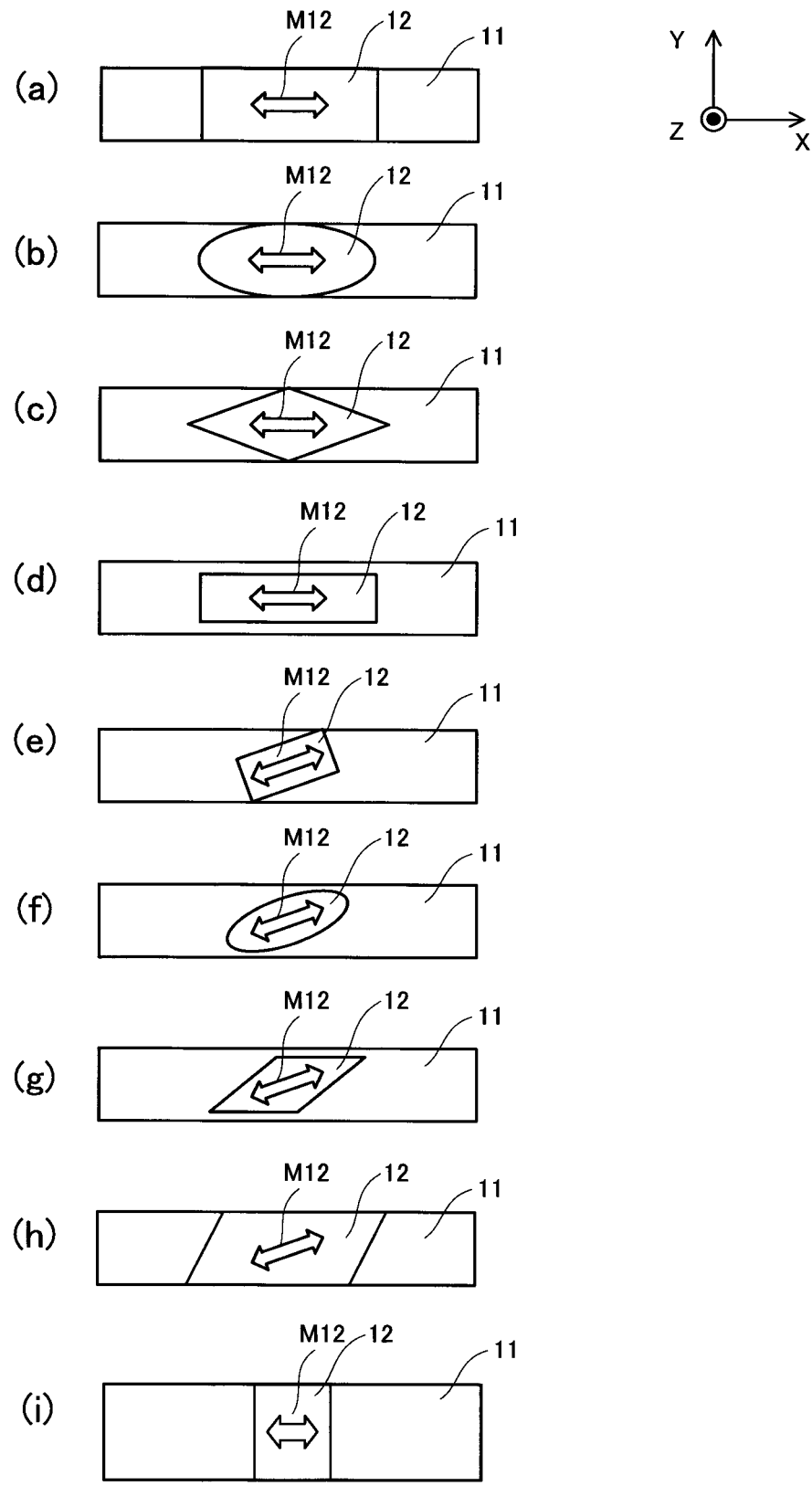
FIG. 14 including portions (a) to (i) is a view illustrating examples of the plane configuration of a heavy metal layer and a recording layer, as well as the directions of the magnetization and the magnetization easy axis of the recording layer.

For example, the planar shape of the recording layer 12 is exemplified in portions (a) to (i) of FIG. 14. The planar shape of the recording layer 12 is any shape such as oblong (portions (a), (d), (e) and (i)), ellipse (portions (b) and (f)) or rhombus (portions (c), (g) and (h)). The width of the recording layer 12 may be less than the width of the heavy metal layer 11 as in portions (d) and (g) of FIG. 14. The position of the recording layer 12 relative to the heavy metal layer 11 is also arbitrarily determined.

Furthermore, the direction of the magnetization M12 of the recording layer 12, in other words, the direction of the magnetization easy axis of the recording layer 12 is not required to be purely the X-axis direction. The magnetization easy axis of the recording layer 12 may include a Y-axis component, rather preferably includes a Y-axis component.

Modified Embodiment 4

Figure 17:
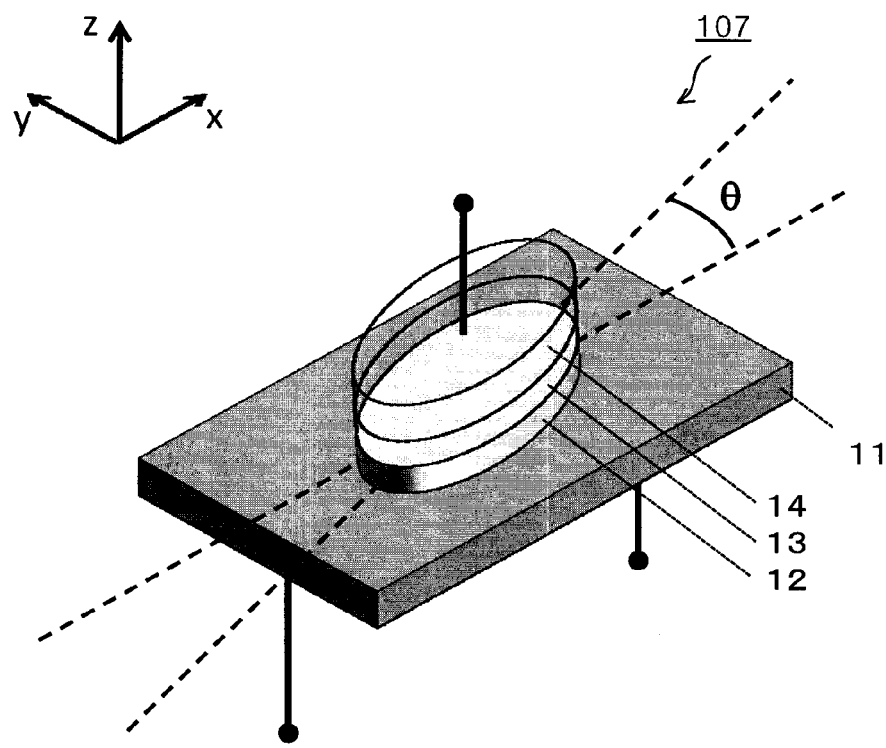
FIG. 17 is a view illustrating the structure of a magnetoresistance effect element according to Modified Embodiment 4, where the magnetization easy axis of a recording layer is formed at an angle relative to the longitudinal direction of a heavy metal layer.

FIG. 17 illustrates a magnetoresistance effect element 107 where the magnetization easy axis of the recording layer 12 is not purely in the X-axis direction. An example is illustrated where the planar shape of the heavy metal layer 11 is a rectangular shape, and the planar shapes of the recording layer 12 to the reference layer 14 are each an ellipse. The magnetization easy axis of the recording layer 12 is defined in the main axis direction of an ellipse. The magnetization easy axis of the recording layer 12 is directed to a direction at an angle θ to the X-axis (the longitudinal direction of the heavy metal layer 11) in the X-Y plane. When the magnetization easy axis of the recording layer 12 includes a Y-axis component, the external magnetic field applying device 31, and the auxiliary magnetic layers 15 and 17 are unnecessary. This is based on two reasons: the occurrence of asymmetry in the function of the spin-orbit torque; and the action of the lateral magnetic field. It is more preferable from the reasons that the direction of the magnetization easy axis of the recording layer 12 be not a pure X-axis direction, but also includes a Y-axis component.

Figure 18:
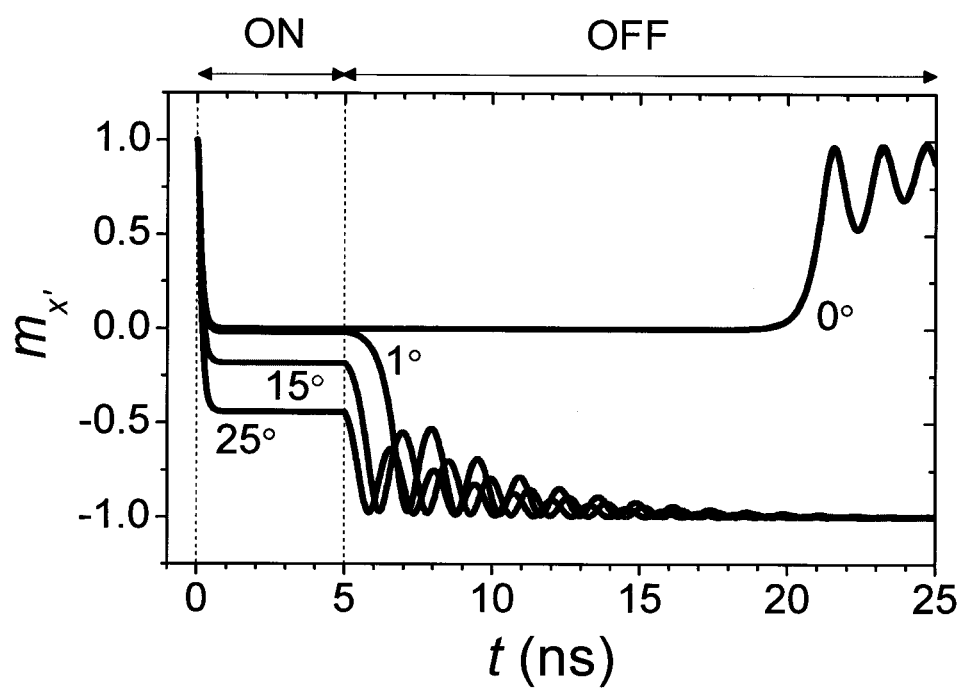
FIG. 18 is a graph representing the easy axis angle dependence of the change over time in easy axis direction component of magnetization in the magnetoresistance effect element according to Modified Embodiment 4.

FIG. 18 illustrates the calculation results by macrospin simulation of the time evolution of the easy axis component mx of the recording layer 12 at an angle θ of each of 0 degrees, 1 degree, 15 degrees and 25 degrees. Specifically, a current pulse of 5 ns was applied to the magnetoresistance effect element 107 and the change over time in the easy axis component mx of the recording layer 12 during application of the current pulse (ON) and after application of the current pulse (OFF) was determined. No magnetic field is here applied in the Z direction.

When the angle θ is 0 degrees, the easy axis component mx is turned back to the initial value (1) after application of the current pulse. On the other hand, when the angle θ is each of 1 degree, 15 degrees and 25 degrees, the easy axis component mx is changed to a value (−1) opposite to the initial value. In order to reduce the size of the magnetoresistance effect element, it is not desirable that the Y-axis component of the magnetization easy axis of the recording layer 12 be large. In consideration of the following: an unavoidable variation in the angle caused by a process is about 3 degrees, a suitable range of the angle in the X-Y plane of the magnetization easy axis of the recording layer 12 is desirably set to ±3 degrees to ±25 degrees, further desirably ±3 degrees to ±15 degrees when the angle in the X-axis direction is defined as 0 degrees. The planar shape of the recording layer 12 is also arbitrarily determined.

When the structures as illustrated in portions (a) and (h) of FIG. 14 are adopted, the following advantage is achieved: the recording layer 12 can be patterned by a self-alignment process. In addition, the recording layer 12 is not required to be patterned into a shape where the X-axis direction serves as the longitudinal direction, as long as the magnetization easy axis thereof includes an X-axis direction component. For example, as illustrated in portion (i) of FIG. 14, the length in the X-axis direction may be less than the length in the Y-axis direction. For example, the X-axis direction can also serve as the magnetization easy axis due to crystal magnetic anisotropy and/or stress-induced magnetic anisotropy via magnetostriction, independent from the length in the X-axis direction of the recording layer 12.

Modified Embodiment 5

In the embodiments, the recording layer 12 is arranged only between the heavy metal layer 11 and the reference layer 14. Alternatively, as illustrated in FIG. 15A to FIG. 15C, the recording layer 12 may be arranged on each of upper and lower surfaces of the heavy metal layer 11. The recording layer 12 here includes a pair of recording layers 12a and 12b with the heavy metal layer 11 interposed therebetween. The directions of the magnetizations M12a and M12b of the recording layers 12a and 12b are required that the recording layers 12a and 12b each of upper and lower are coupled to be antiparallel with each other. In the configuration, electrons including polarized spins reversely directed on each of upper and lower surfaces of the heavy metal layer 11 are accumulated on the recording layers 12a and 12b, as described with reference to FIG. 6A. Therefore, the magnetization directions of the recording layers 12a and 12b, which are each of upper and lower, are antiparallel with each other, thereby causing no problems.

The recording layers 12a and 12b located on each of upper and lower surfaces of the heavy metal layer 11 are here magnetically coupled by a static magnetic field. Thus, while heat stability is increased, the threshold current required for rewrite is not increased. Accordingly, heat stability can be enhanced without any increase in the write current Iw. In addition, as illustrated in FIG. 13A to FIG. 13D, the auxiliary magnetic layers 15 and 17 can be each arranged to thereby make a static external magnetic field unnecessary.

Modified Embodiment 6

Figure 16:
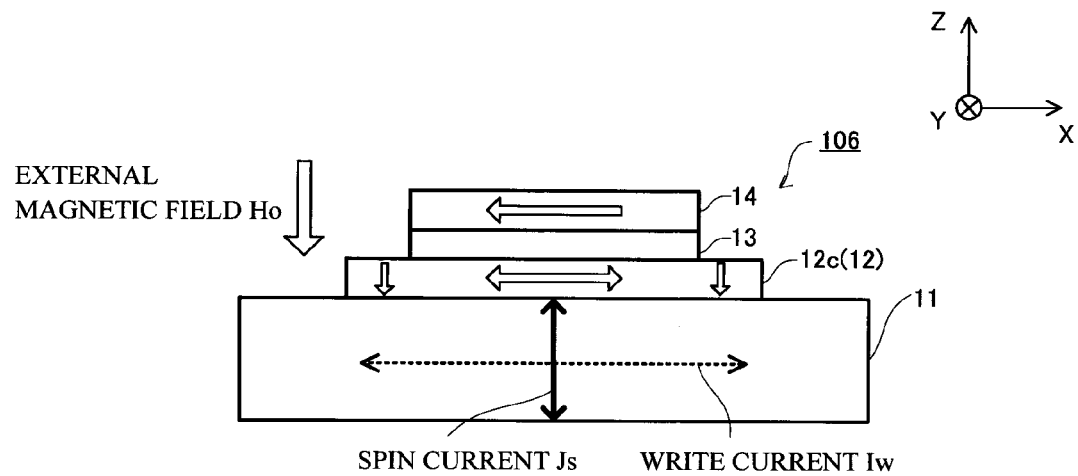
FIG. 16 is a view exemplifying the configuration of a magnetoresistance effect element including a recording layer with a plurality of regions different in the magnetization direction.

The magnetization easy axis (direction of magnetization) of the recording layer 12 is not required to be homogeneous in the recording layer, and a plurality of regions having magnetizations different in direction may be provided. For example, some of the regions may be easy in perpendicular magnetization and the directions may be fixed, as in the recording layer 12c illustrated in FIG. 16. That is, the recording layer 12 may include any region different in the magnetization easy axis or the magnetization direction, provided that a region having a magnetization easy axis including an X-axis direction component is required to be present in the recording layer 12. An effective magnetic field in the perpendicular direction acts, also in the case, via exchange coupling in the in-plane magnetization easy region of the recording layer, and therefore the external magnetic field applying device 31 is unnecessary.

Modified Embodiment 7

Even when the magnetoresistance effect element by itself has the ability to generate the magnetic field in the Z-axis direction in the above embodiments and modified embodiments, an external magnetic field may be applied by the external magnetic field applying device 31. In addition, while the X-axis direction is set to the long axis (elongation) direction of the heavy metal layer 11 and the external magnetic field is applied in the Z-axis direction in the above embodiments and modified embodiments, any coordinate may be taken.

Modified Embodiment 8

Figure 19A:
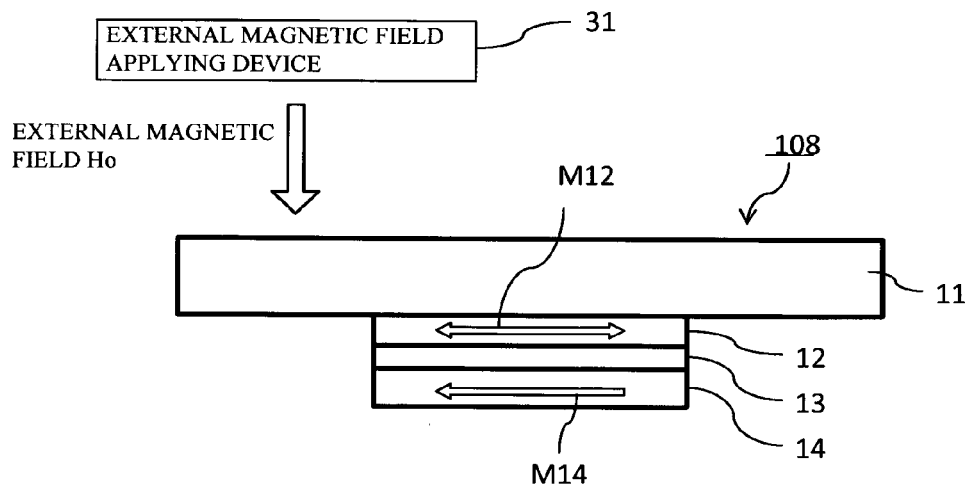
FIG. 19A is a view illustrating the structure of a magnetoresistance effect element according to Modified Embodiment 8, including a reference layer, a barrier layer, a recording layer and a heavy metal layer sequentially laminated closer to a substrate.

While the magnetoresistance effect element 100 is formed with the heavy metal layer 11, the recording layer 12, the barrier layer 13 and the reference layer 14 being laminated in this order closer to the substrate in the above embodiments, such lamination order may be reversed. FIG. 19A illustrates a magnetoresistance effect element 108 where such lamination order is reversed. The magnetoresistance effect element 108 is formed with the reference layer 14, the barrier layer 13, the recording layer 12 and the heavy metal layer 11 being laminated in this order closer to the substrate. The reference layer 14 has, also in the case, magnetization M14 whose direction is fixed, and the recording layer 12 has magnetization M12 that can be inverted. In addition, an external magnetic field Ho in a direction perpendicular to the film surface is applied to the magnetoresistance effect element 100 by the external magnetic field application mechanism 31.

Figure 19B:
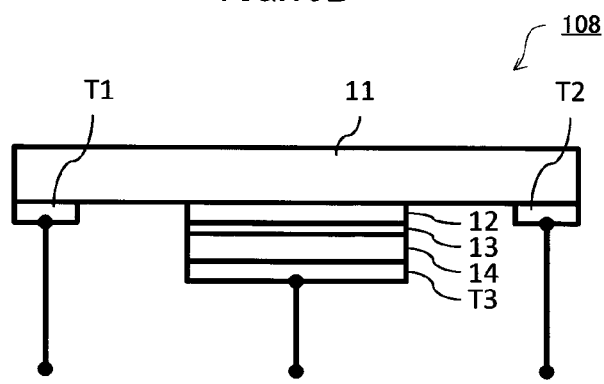
FIG. 19B is a view illustrating one example of a terminal arrangement of the magnetoresistance effect element according to Modified Embodiment 8.
Figure 19C:
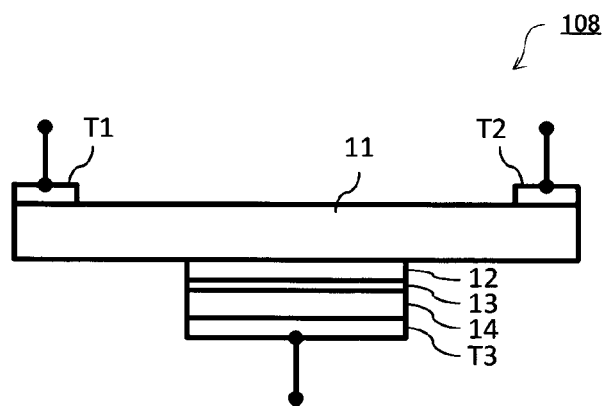
FIG. 19C is a view illustrating another example of the terminal arrangement of the magnetoresistance effect element according to Modified Embodiment 8.

The magnetoresistance effect element 108 has two variations with respect to the arrangement of terminals T1, T2 and T3. As illustrated in FIG. 19B, all of a first terminal T1 and a second terminal T2 connected to one end and the other end of the heavy metal layer 11, respectively, and a third terminal T3 connected to the reference layer 14 may be provided closer to the substrate. Alternatively, as illustrated in FIG. 19C, the first terminal T1 and the second terminal T2 may be provided opposite to the substrate, and the third terminal T3 may be provided closer to the substrate. All the terminals can be provided closer to the substrate as in FIG. 19B, to thereby allow any wiring on the upper portion of the magnetoresistance effect element 100 to be unnecessary, resulting in a decrease in cell size. The structure in FIG. 19C can allow for an effective layout when an input signal is supplied from the upper portion of the magnetoresistance effect element 100.

In the magnetoresistance effect element 108, a magnetic tunneling junction including the recording layer 12, the barrier layer 13 and the reference layer 14 has a so-called bottom pin structure. The bottom pin structure generally can allow the magnetization of the reference layer 14 to be more firmly fixed than a top pin structure, and therefore a bottom pin structure indicated in Modified Embodiment 8 is more suitable in terms of the degree of freedom in designing of a magnetic tunneling junction film.

In order to produce the magnetoresistance effect element 108, a magnetic tunneling junction portion including the reference layer 14, the barrier layer 13 and the recording layer 12 is first patterned, and thereafter the heavy metal layer 11 is separately formed. It is here desirable that a cap layer including a heavy metal material large in spin Hall angle be formed on the upper portion of the recording layer 11 and be collectively patterned in the first pattering of the magnetic tunneling junction portion so that the spin-orbit torque more efficiently acts on the recording layer 12. The heavy metal material may be the same as or different from the material of the heavy metal layer 11 to be formed later.

EXAMPLES

Hereinafter, the evaluation results of the magnetoresistance effect element 100 according to the present disclosure prototyped by the inventors are shown.

Figure 20:
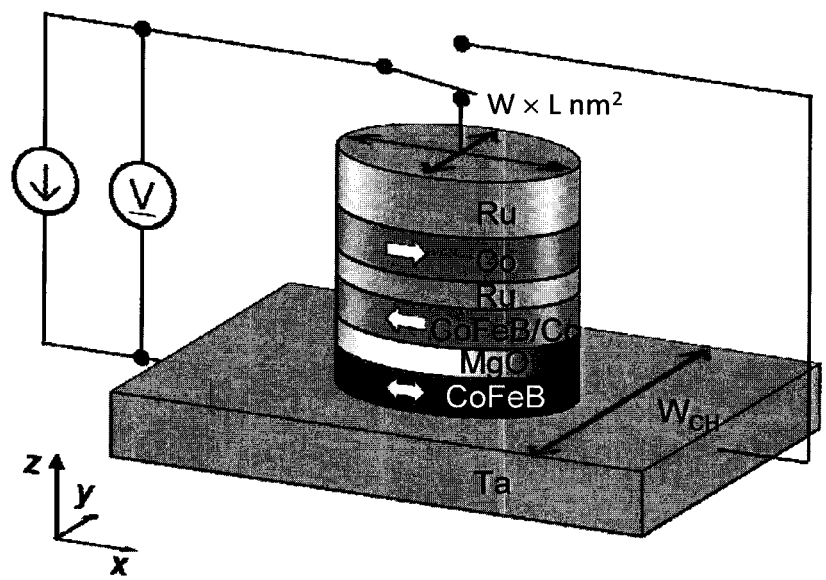
FIG. 20 is a view illustrating the structure of a magnetoresistance effect element according to Examples.

FIG. 20 schematically illustrates the structure of the magnetoresistance effect element prototyped. A laminated film was deposited on a Si substrate having an oxide film. Respective components of the film structure, closer to the substrate, are sequentially shown as follows. Numerical values in round brackets correspond to the thickness values of films for use in the element actually prototyped. Numerical values in square brackets correspond to the film thickness ranges that have been revealed to impart the same effect, based on measurement of the magnetization curve. Ta (5 or 10 nm) [1 to 20 nm], CoFeB (1.48 or 1.56 nm) [1.40 to 1.80 nm], MgO (1.8 nm) [1.1 to 2.4 nm], CoFeB (1.5 nm) [1.0 to 2.5 nm], Co (1.0 nm) [0.5 to 2.5 nm], Ru (0.92 nm) [0.85 to 1.05 nm], Co (2.4 nm) [1.5 to 3.5 nm], and Ru (5 nm) [1 to 20 nm].

Fe can be used for each of upper and lower layers (Co layers) of Ru, instead of Co. Alternatively, an alloy of Co and Fe can be used for the layer. Only MgO in the above film structure was deposited by RF magnetron sputtering. Other layers than MgO were deposited by DC magnetron sputtering. The thin films deposited were heat-treated at 300° C. for 1 hour. The temperature in the heat treatment is desirably set to 200° C. or more and 450° C. or less, more suitably set in the range from 250° C. from 400° C.

The thin films deposited were processed into a structure illustrated in FIG. 20, by electron beam lithography and Ar ion-milling. As illustrated in FIG. 20, only Ta serving as a lowermost layer was pattered into a rectangle (oblong) where the length of a short side of the planar shape was $W_{CH}$. A layer on Ta, corresponding to a magnetic tunneling junction, was pattered into an ellipse where the lengths of a minor axis and a major axis of the planar shape were W and L, respectively. The values of $W_{CH}$, W and L of the element prototyped were as follows: $W_{CH}$: 640 nm or 1200 nm; W: 60 to 160 nm, and L: 120 to 640 nm.

The value of $W_{CH}$ is preferably close to the value of W. The inventors used electron beam lithography for processing of the thin films. Indeed, photolithography by ArF laser, KrF laser or the like, however, can also be used. In addition, not Ar ion-milling, but reactive ion etching can also be used. In particular, when etching is conducted using methanol, Ta as the lowermost layer can serve as a stopper of etching, to thereby allow the element to be precisely formed.

In the magnetoresistance effect element produced, the Ta layer corresponds to the heavy metal layer 11, CoFeB corresponds to the recording layer 12, and MgO corresponds to the barrier layer 13. CoFeB/Co/Ru/Co on MgO corresponds to the reference layer 14. A switch was connected to an upper electrode of the reference layer 14, a DC power supply and a DC voltmeter were connected as illustrated in FIG. 20, and magnetization inversion property was measured.

Figure 21:
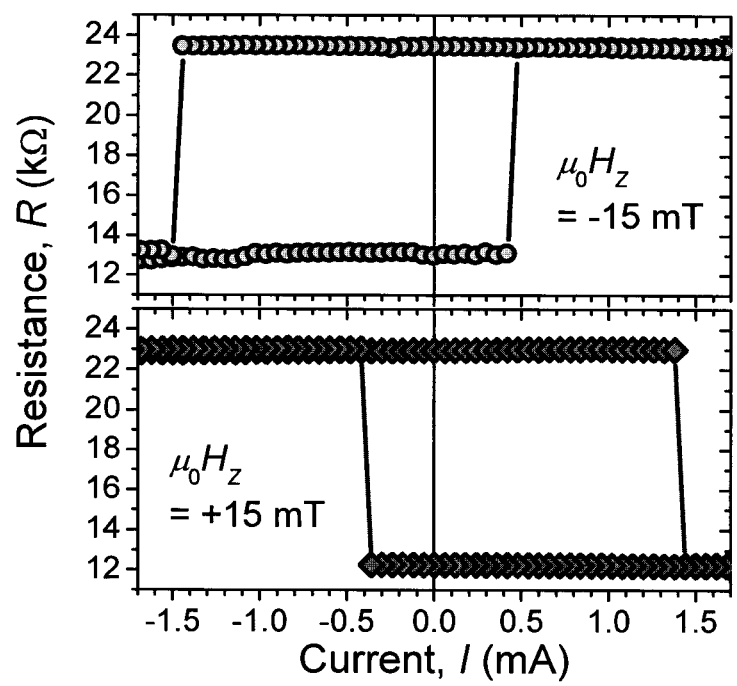
FIG. 21 is a graph representing the measurement results with respect to a relationship between the magnetic tunneling junction resistance and the applied current of the magnetoresistance effect element according to Examples.

FIG. 21 illustrates a relationship between the resistances of the respective magnetic tunneling junctions where the perpendicular magnetic field was applied at −15 mT and +15 mT, and the current introduced into the heavy metal layer (R-I characteristics). The pulse width of the current used was 0.5 seconds. As described above, it was found that the resistance of the magnetic tunneling junction was changed as the magnetization of the recording layer 12 was inverted by the current.

Figure 22A:
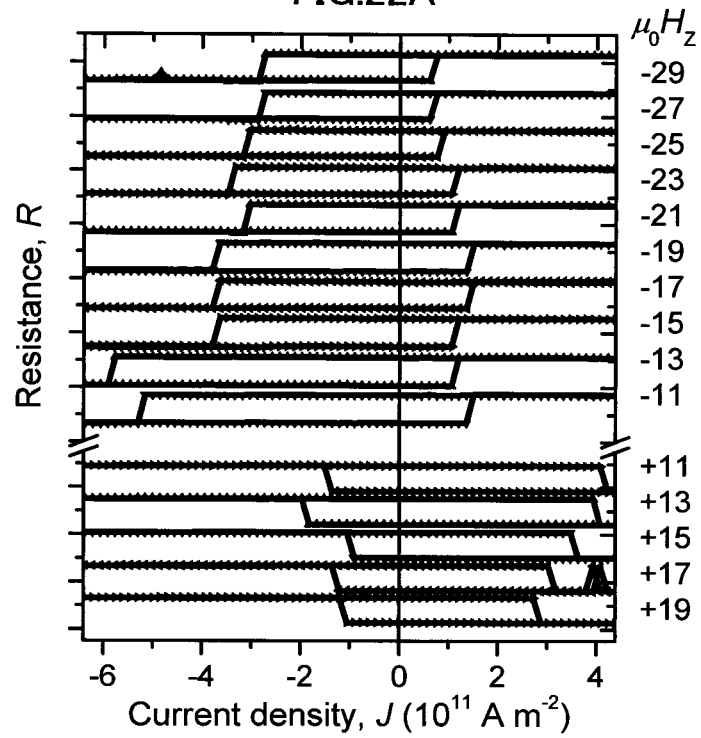
FIG. 22A is a graph representing the measurement results of the external magnetic field dependence in the perpendicular direction, of a relationship between the magnetic tunneling junction resistance and the applied current of the magnetoresistance effect element according to Examples.
Figure 22B:
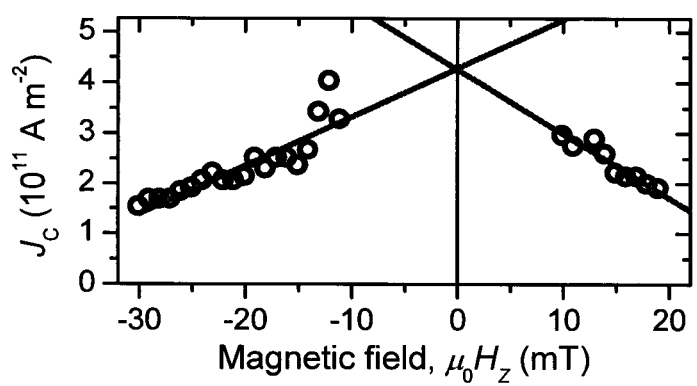
FIG. 22B is a graph representing the measurement results of the inversion current and the external magnetic field dependence in the perpendicular direction of the magnetoresistance effect element according to Examples.

FIG. 22 illustrates the measurement results of R-I characteristics with the change in perpendicular magnetic field. FIG. 22A illustrates the measurement results of R-I loops in respective perpendicular magnetic fields. FIG. 22B illustrates a relationship between the inversion threshold current density and the perpendicular magnetic field. It has been found that magnetization inversion of the perpendicular magnetic field (Ho) occurred in the ranges from 11 mT to 29 mT and from −11 mT to −29 mT. Magnetization inversion could be confirmed at an external magnetic field Ho of 8 mT or more in measurement of a plurality of the elements. The inversion current density was in the order of $10^{11}$ A/m², and was a sufficiently low value for ensuring reliability. R-I characteristics illustrated in FIG. 21 and FIG. 22, namely, rewrite properties by the current were observed in all the elements produced, except for any element poor in resistance. Some of the elements were subjected to measurement of a heat stability index $E/k_BT$, and the value was about 46. The value exceeds 40 corresponding to a value ensuring information retention property for 10 years.

Figure 23:
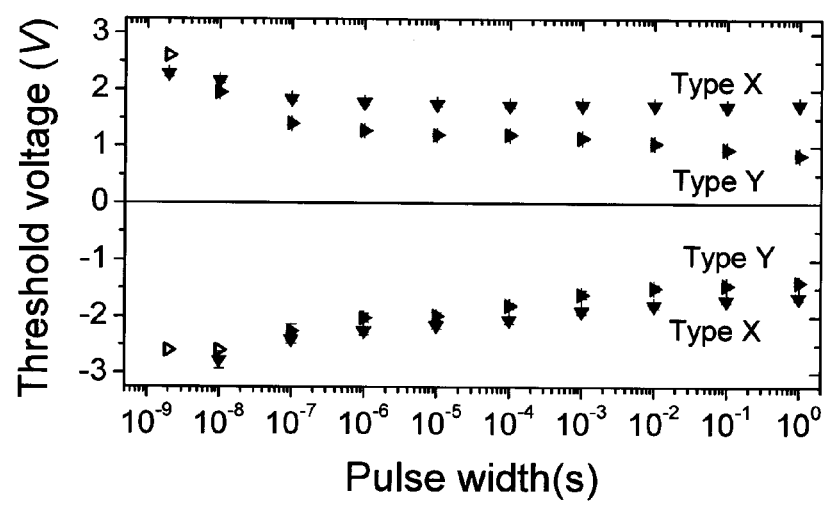
FIG. 23 is a graph representing the measurement results of a relationship between the threshold voltage and the pulse width of the magnetoresistance effect element according to Examples.

FIG. 23 illustrates the evaluation results of the magnitude of the pulse current required for magnetization inversion, with the change in the width of the current pulse from 1 s to 2 ns. The magnetoresistance effect element (Type X) according to the present disclosure, and the same magnetoresistance effect element (Type Y) as disclosed in Patent Literature 2 were here produced and subjected to measurement. The magnetoresistance effect element (Type X) according to the present disclosure has a configuration where the magnetization easy axis of the recording layer 12 is in the in-film plane direction and is to a direction parallel with the write current. On the other hand, the magnetoresistance effect element (Type Y) is the same magnetoresistance effect element as disclosed in Patent Literature 2, and has a configuration where the magnetization easy axis of the recording layer 12 is in the in-film plane direction and is in a direction perpendicular to the write current. The horizontal axis and the vertical axis in the graph represent the width of the current pulse and the output set voltage of a pulse generator, respectively. In addition, each open symbol plotted means that no magnetization inversion could be confirmed at a current pulse equal to or less than each pulse indicated by such a symbol.

Magnetization can be more inverted at a low current in Type Y until the pulse width is around 10 ns. On the contrary, magnetization can be more inverted at a low current in Type X at a pulse width of 2 ns.

Figure 24:
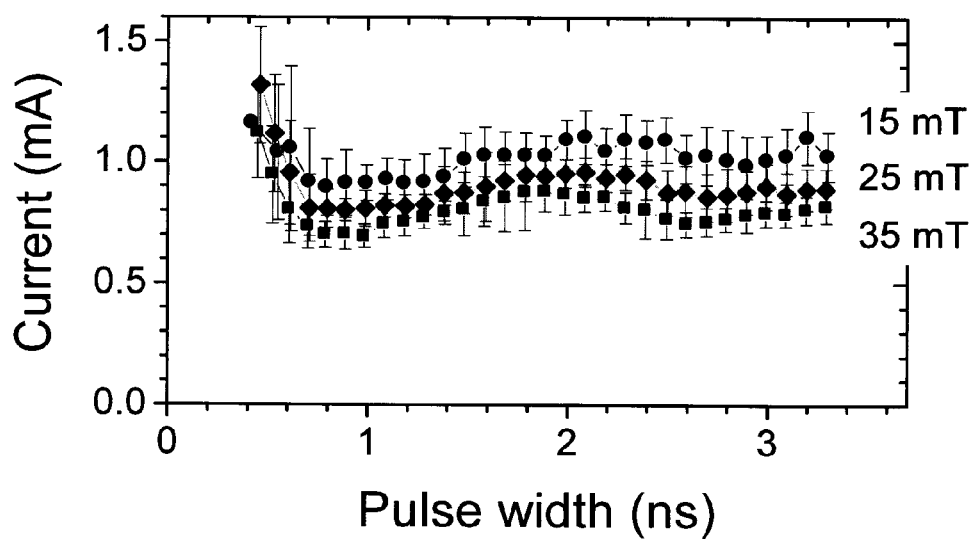
FIG. 24 is a graph representing the measurement results of a relationship between the threshold current and the pulse width (in nano- and subnano-second domains) of the magnetoresistance effect element according to Examples.

FIG. 24 illustrates the results of the pulse width dependence evaluated at about nanoseconds with respect to the magnetoresistance effect element according to the present disclosure. The external magnetic field Ho in the perpendicular direction was changed to 15 mT, 25 mT, and 35 mT. Measurement was performed 50 times and the average of the measurement values was plotted. Each error bar represents the standard deviation. The horizontal axis represents the pulse width. The pulse width corresponds to a 50%-50% value read with an oscilloscope. The vertical axis represents the current value. The current value is a value obtained by dividing the transmission voltage read with an oscilloscope by 50 S) corresponding to an internal impedance. As illustrated in FIG. 24, the threshold current is found to be vibrated relative to the pulse width. The reason is considered because, after the pulse current is switched off, magnetization responds the precession occurring around a synthetic magnetic field including the anisotropic magnetic field of the recording layer 12 and the external magnetic field Ho in the perpendicular direction. Thus, the width of the current pulse can controlled to thereby more reduce the current required for rewrite. More specifically, it has been found that a current pulse having a shape close to a rectangle can be applied to the magnetoresistance effect element according to the present disclosure, here prototyped, and the width of the current pulse can be set to 0.3 ns to 1.2 ns to thereby efficiently induce magnetization inversion.

Characteristics, when the magnetoresistance effect element according to the present disclosure was formed on a most advanced semiconductor manufacturing line, were approximately estimated based on the resulting experimental results. The numerical values estimated are as follows.

Write current: 0.06±0.03 mA
Resistance of write path: 1000±400 Ω
Write voltage: 60±30 mV
Write time: 450±100 ps
Write energy: 1.6±1.0 pJ It is indicated that performances comparable with or better than performances of a current semiconductor-based memory such as SRAM can be realized in terms of a cell area and an energy cost that are equal to or less than the cell area and energy cost of the current semiconductor-based memory, respectively. The present disclosure is thus clearly useful.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The present application is based on Japanese Patent Application No. 2014-163176 filed on Aug. 8, 2014. The entities of the specification, claims and drawings of Japanese Patent Application No. 2014-163176 are herein incorporated by reference.

REFERENCE SIGNS LIST

100 Magnetoresistance effect element
11 Heavy metal layer
12, 12a, 12b, 12c Recording layer
13 Barrier layer
14 Reference layer
14a, 14c Ferromagnetic layer
14b Coupling layer
14d Antiferromagnetic layer
15, 17 Auxiliary magnetic layer
16 Conductive layer
31 External magnetic field applying device
101 to 108 Magnetoresistance effect element
200 Magnetic memory cell circuit
300 Magnetic memory device
311 Memory cell array
312 X driver
313 Y driver
314 Controller

The invention claimed is:
1. A magnetoresistance effect element comprising:
a heavy metal layer that comprises a heavy metal and that is formed to extend in a first direction;
a recording layer that comprises a ferromagnetic material and that is provided adjacent to the heavy metal layer;
a barrier layer that comprises an insulating material and that is provided on the recording layer with being adjacent to a surface of the recording layer, the surface being opposite to the heavy metal layer;
a reference layer that comprises a ferromagnetic material and that is provided adjacent to a surface of the barrier layer, the surface being opposite to the recording layer;
a first terminal connected to one end of the heavy metal layer;

a second terminal connected to the other end of the heavy metal layer; and a third terminal connected to the reference layer, wherein a direction of magnetization of the reference layer includes a component substantially fixed in the first direction, a direction of magnetization of the recording layer includes a component variable in the first direction, and a current having a direction same as the first direction is introduced to the heavy metal layer to enable the magnetization of the recording layer to be inverted.

2. The magnetoresistance effect element according to claim 1, wherein the magnetization of the recording layer is inverted by a vertical magnetic field that is applied to the recording layer by introducing a current to the heavy metal layer.

3. The magnetoresistance effect element according to claim 1, wherein a pulse width of the current introduced to the heavy metal layer is less than 10 nanoseconds.

4. The magnetoresistance effect element according to claim 1, wherein a magnetization easy axis of the recording layer is directed to a direction within ±25 degrees relative to the first direction.

5. The magnetoresistance effect element according to claim 1, wherein the recording layer is formed to be substantially two-fold symmetric in a layer surface and a longitudinal direction thereof includes a component in the first direction.

6. A magnetoresistance effect element comprising:

a heavy metal layer that comprises a heavy metal and that is formed to extend in a first direction;

a recording layer that comprises a ferromagnetic material and that is provided adjacent to the heavy metal layer;

a barrier layer that comprises an insulating material and that is provided on the recording layer with being adjacent to a surface of the recording layer, the surface being opposite to the heavy metal layer;

a reference layer that comprises a ferromagnetic material and that is provided adjacent to a surface of the barrier layer, the surface being opposite to the recording layer; and an auxiliary magnetic layer that comprises magnetization in a direction perpendicular to a layer surface of the recording layer, wherein a direction of magnetization of the reference layer includes a component substantially fixed in the first direction, a direction of magnetization of the recording layer includes a component variable in the first direction, and a current having a direction same as the first direction is introduced to the heavy metal layer to enable the magnetization of the recording layer to be inverted.

7. A magnetoresistance effect element comprising:

a heavy metal layer that comprises a heavy metal and that is formed to extend in a first direction;

a recording layer that comprises a ferromagnetic material and that is provided adjacent to the heavy metal layer;

a barrier layer that comprises an insulating material and that is provided on the recording layer with being adjacent to a surface of the recording layer, the surface being opposite to the heavy metal layer; and a reference layer that comprises a ferromagnetic material and that is provided adjacent to a surface of the barrier layer, the surface being opposite to the recording layer, wherein a direction of magnetization of the reference layer includes a component substantially fixed in the first direction, a direction of magnetization of the recording layer includes a component variable in the first direction, a current having a direction same as the first direction is introduced to the heavy metal layer to enable the magnetization of the recording layer to be inverted, and the recording layer is singly arranged on each of upper and lower surfaces of the heavy metal layer.

8. A magnetoresistance effect element comprising:

a heavy metal layer that comprises a heavy metal and that is formed to extend in a first direction;

a recording layer that comprises a ferromagnetic material and that is provided adjacent to the heavy metal layer;

a barrier layer that comprises an insulating material and that is provided on the recording layer with being adjacent to a surface of the recording layer, the surface being opposite to the heavy metal layer; and a reference layer that comprises a ferromagnetic material and that is provided adjacent to a surface of the barrier layer, the surface being opposite to the recording layer, wherein a direction of magnetization of the reference layer includes a component substantial fixed in the first direction, a direction of magnetization of the recording layer includes a component variable in the first direction, a current having a direction same as the first direction is introduced to the heavy metal layer to enable the magnetization of the recording layer to be inverted, and the recording layer comprises a plurality of regions where a magnetization easy axis is directed to a different direction.

9. The magnetoresistance effect element according to claim 1, wherein the recording layer comprises CoFeB or FeB, and the barrier layer comprises MgO.

10. The magnetoresistance effect element according to claim 1, wherein the recording layer comprises CoFeB and a thickness of the recording layer is more than 1.4 nm.

11. The magnetoresistance effect element according to claim 3, wherein the pulse width of the current introduced to the heavy metal layer is 0.3 nanoseconds or more and less than 1.2 nanoseconds.

12. The magnetoresistance effect element according to claim 4, wherein the magnetization easy axis of the recording layer is directed to a direction at ±3 degrees or more and ±25 degrees or less relative to the first direction.

13. A magnetic memory device comprising:

the magnetoresistance effect element according to claim 1;

write means that writes data in the magnetoresistance effect element by applying a write current to the magnetoresistance effect element to a direction including a component in the first direction; and read means that reads the data written in the magnetoresistance effect element by determining a resistance between the heavy metal layer and the reference layer.

* * * * *

UNITED STATES PATENT AND TRADEMARK OFFICE
CERTIFICATE OF CORRECTION

PATENT NO.          : 9,941,468 B2
APPLICATION NO.     : 15/502442
DATED               : April 10, 2018
INVENTOR(S)         : Fukami et al.

Page 1 of 1

It is certified that error appears in the above-identified patent and that said Letters Patent is hereby corrected as shown below:

On the Title Page

Under "(72) Inventors," please correct the misspelling of the second named inventor as follows:
Delete "Chaoling" and insert --Chaoliang-- therefor.

Signed and Sealed this
Fifteenth Day of May, 2018

Andrei Iancu
*Director of the United States Patent and Trademark Office*